United States Patent
Siu

(10) Patent No.: US 7,422,053 B2
(45) Date of Patent: Sep. 9, 2008

(54) VAPOR AUGMENTED HEATSINK WITH MULTI-WICK STRUCTURE

(75) Inventor: Wing Ming Siu, Kowloon (HK)

(73) Assignee: Convergence Technologies (USA), LLC, Reston, VA (US)

( * ) Notice: Subject to any disclaimer, the term of this patent is extended or adjusted under 35 U.S.C. 154(b) by 0 days.

(21) Appl. No.: 11/272,145

(22) Filed: Nov. 14, 2005

(65) Prior Publication Data

US 2006/0060330 A1 Mar. 23, 2006

Related U.S. Application Data

(63) Continuation of application No. 10/390,773, filed on Mar. 19, 2003, now abandoned.

(60) Provisional application No. 60/380,274, filed on May 15, 2002.

(51) Int. Cl.
H05K 7/20 (2006.01)

(52) U.S. Cl. .......................... 165/104.26; 165/104.33; 361/700

(58) Field of Classification Search ............ 165/104.26, 165/104.33
See application file for complete search history.

(56) References Cited

U.S. PATENT DOCUMENTS

| | | | |
|---|---|---|---|
| 3,952,797 A | | 4/1976 | Voboril et al. |
| 4,118,756 A | * | 10/1978 | Nelson et al. ............. 361/700 |
| 4,170,262 A | * | 10/1979 | Marcus et al. ......... 165/104.26 |
| 4,351,388 A | * | 9/1982 | Calhoun et al. ........ 165/104.26 |
| 4,523,636 A | | 6/1985 | Meijer et al. |
| 5,076,352 A | * | 12/1991 | Rosenfeld et al. ...... 165/104.26 |
| 5,998,863 A | | 12/1999 | Kobayashi et al. |
| 6,056,044 A | | 5/2000 | Benson et al. |
| 6,082,443 A | * | 7/2000 | Yamamoto et al. ..... 165/104.26 |
| 6,227,287 B1 | * | 5/2001 | Tanaka et al. ............... 165/80.4 |
| 6,263,959 B1 | | 7/2001 | Ikeda et al. |
| 6,302,192 B1 | | 10/2001 | Dussinger et al. |
| 6,317,322 B1 | | 11/2001 | Ueki et al. |
| 6,381,845 B2 | | 5/2002 | Ikeda et al. |
| 6,397,935 B1 | | 6/2002 | Yamamoto et al. |
| 6,410,982 B1 | | 6/2002 | Brownell et al. |
| 6,424,528 B1 | | 7/2002 | Chao |
| 6,460,612 B1 | * | 10/2002 | Sehmbey et al. .............. 165/96 |
| 6,490,160 B2 | | 12/2002 | Dibene, II et al. |

(Continued)

FOREIGN PATENT DOCUMENTS

EP 0 251 836 1/1988

(Continued)

OTHER PUBLICATIONS

Wei et al., "Fin efficiency enhancement using a gravity-assisted planar heat pipe", International Journal of Heat and Mass Transfer, vol. 40, No. 5, pp. 1045-1051, 1997.

(Continued)

Primary Examiner—Allen J Flanigan
(74) Attorney, Agent, or Firm—Edell, Shapiro & Finnan, LLC

(57) ABSTRACT

A heat transfer device includes a base chamber, a fin chamber, and at least one fin. The chambers can be thermally coupled. The heat transfer device also includes a wick structure. The wick structure can include a multi-wick structure. The multi-wick structure can include a three-dimensional wick structure and/or a spatially varying wick structure.

25 Claims, 15 Drawing Sheets

U.S. PATENT DOCUMENTS

| | | | |
|---|---|---|---|
| 6,533,029 B1 * | 3/2003 | Phillips | 165/104.26 |
| 6,863,119 B2 * | 3/2005 | Sugito et al. | 165/104.33 |
| 2002/0144804 A1 | 10/2002 | Liang et al. | |
| 2003/0056942 A1 | 3/2003 | Ota et al. | |
| 2003/0075306 A1 * | 4/2003 | Zuo et al. | 165/104.26 |

FOREIGN PATENT DOCUMENTS

| | | |
|---|---|---|
| EP | 0745819 A2 | 12/1996 |
| EP | 0 910 235 | 4/1999 |
| JP | 2000161879 | 6/2000 |
| JP | 2001-24374 | 1/2001 |

OTHER PUBLICATIONS

O'Connell, "Some Don't Like It Hot", Software Development, pp. 18, Mar. 2003.

Biporous Heat Pipes for High Power Electronic Device Cooling—Abstract of the papers presented at Semi-Therm 2001 (1 page).

M.J. Rightley et al., "Innovative wick design for multi-source, flat plate heat pipes", Microelectronics Journal 34 (2003) pp. 187-194.

* cited by examiner

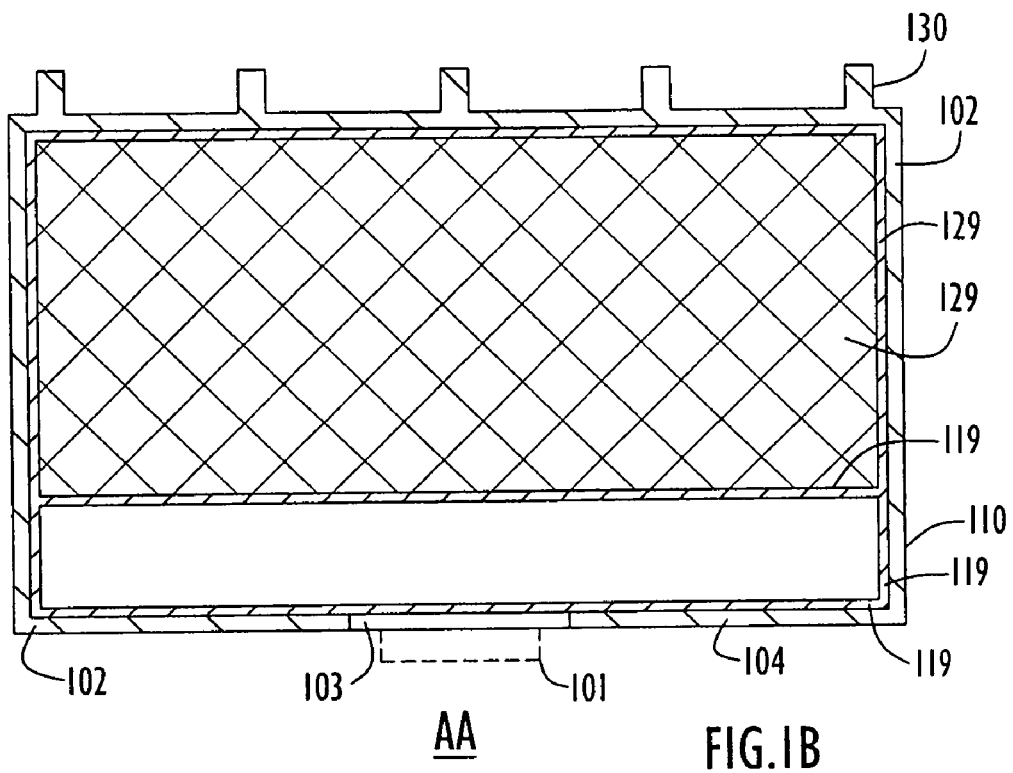
AA    FIG.1B
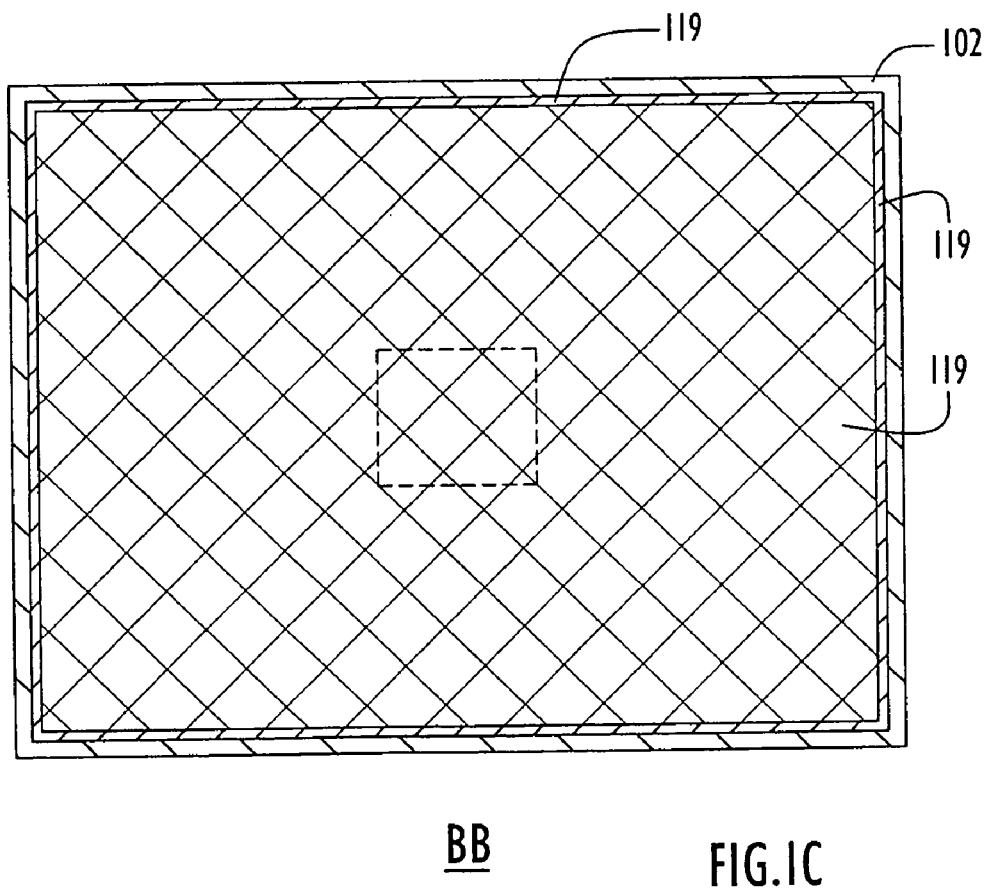
BB    FIG.1C

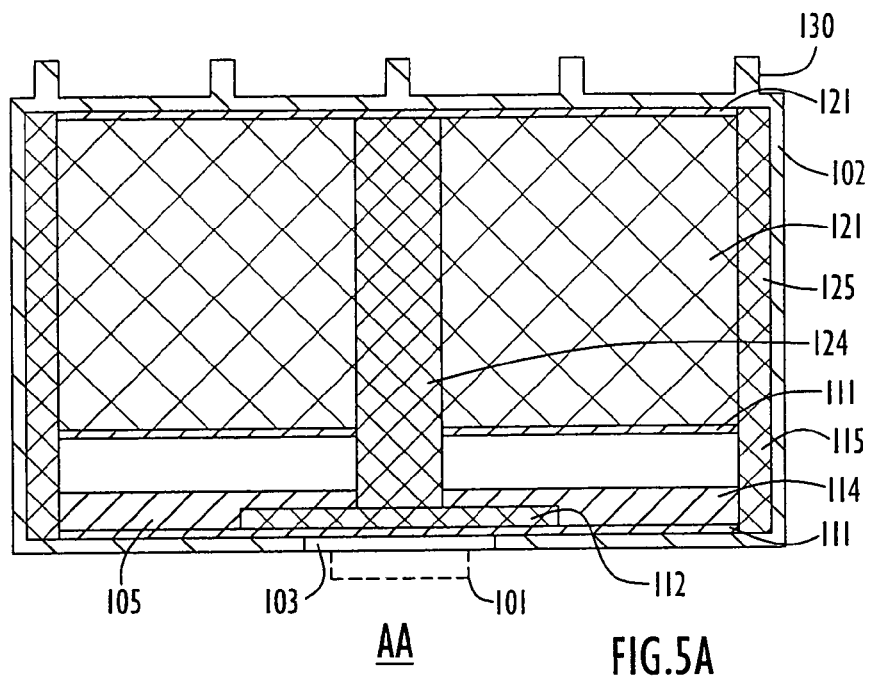
AA  FIG.5A
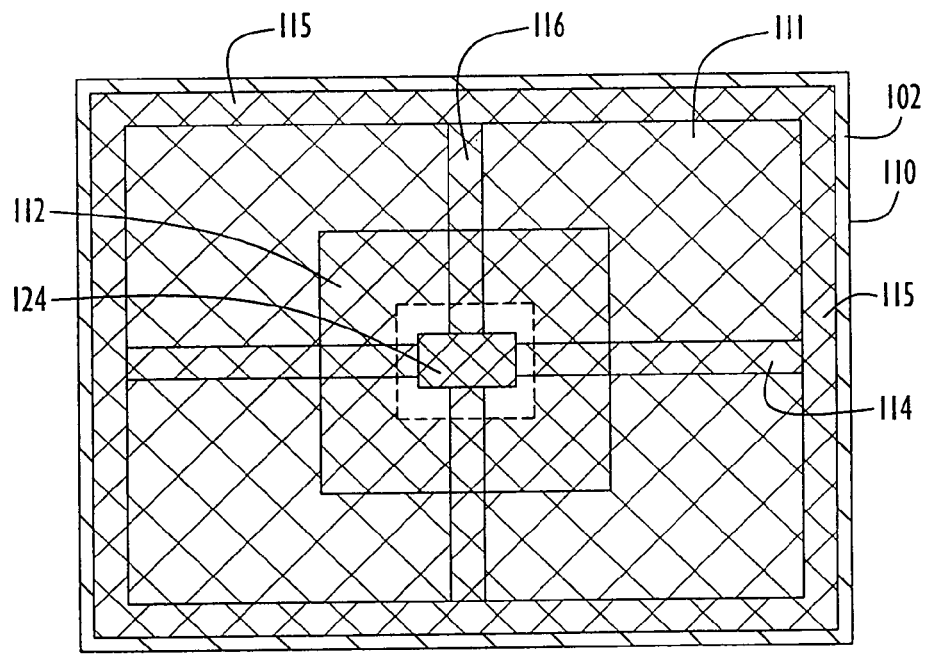
BB  FIG.5B
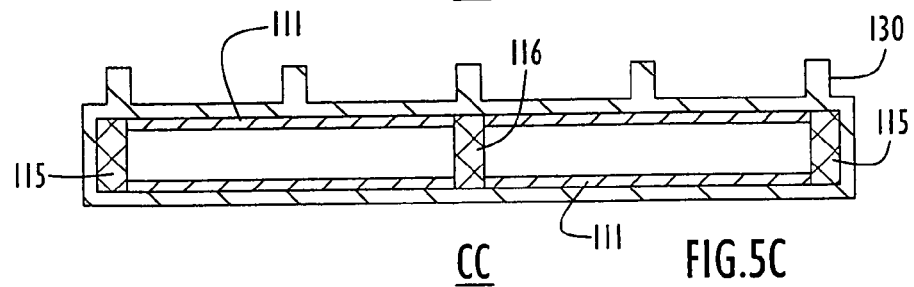
CC  FIG.5C

DD

BB

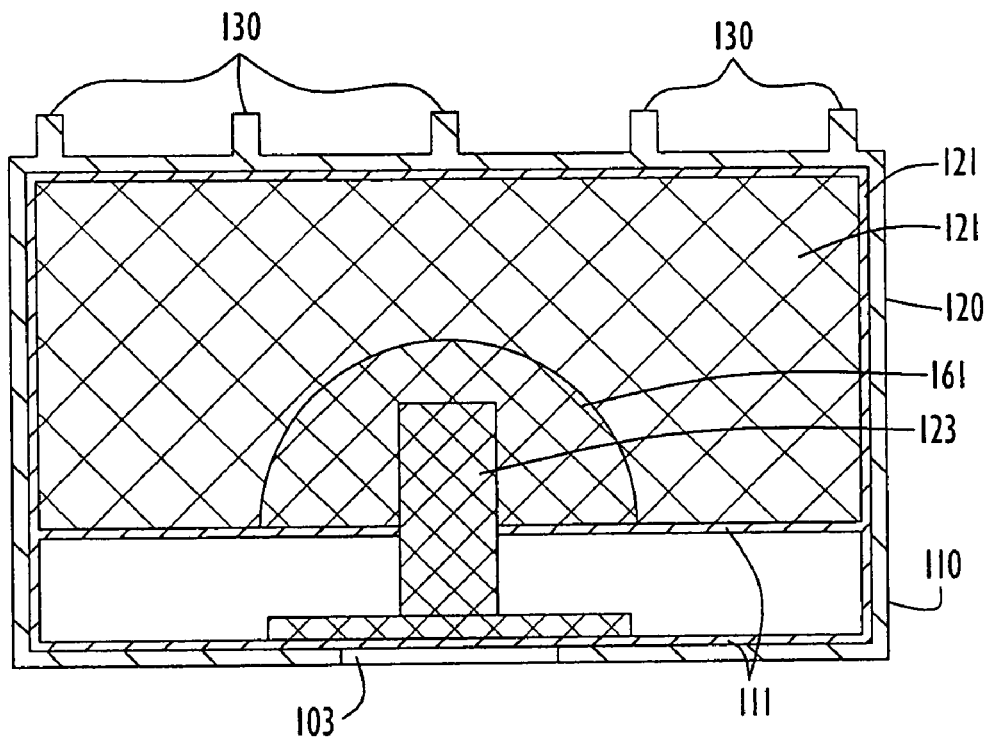
AA  FIG.11A
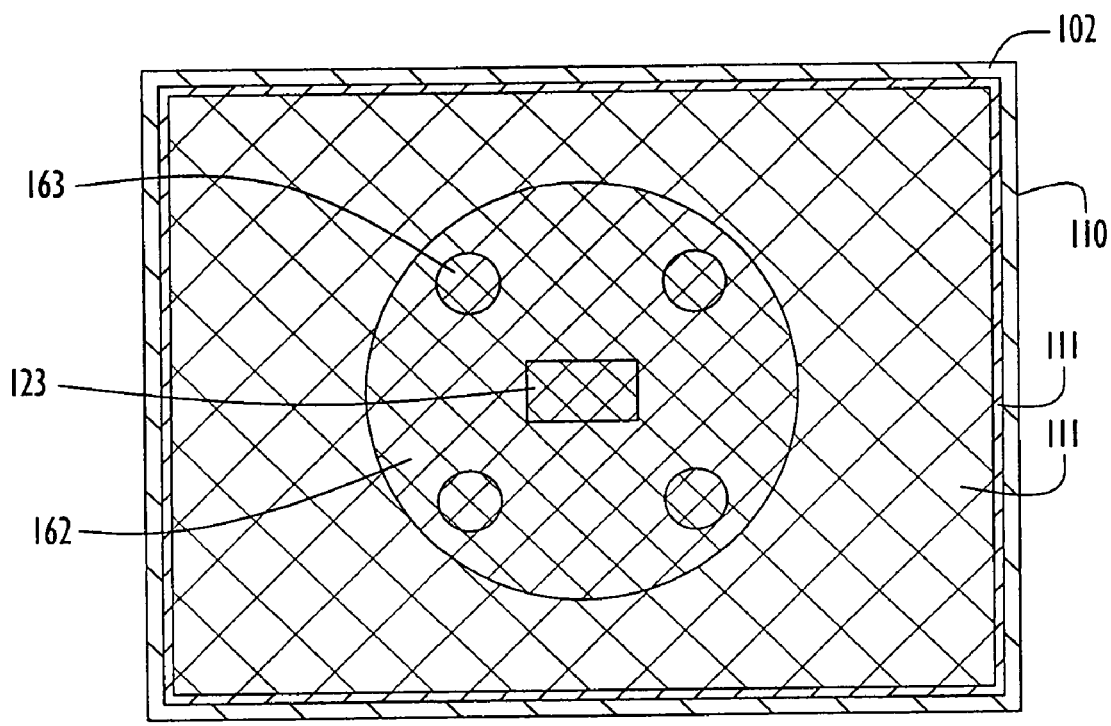
BB  FIG.11B

VAPOR AUGMENTED HEATSINK WITH MULTI-WICK STRUCTURE

CROSS REFERENCE TO RELATED APPLICATIONS

This application is a continuation of U.S. patent application Ser. No. 10/390,773, entitled "Vapor Augmented Heatsink with Multi-Wick Structure", filed Mar. 19, 2003, now abandoned which claims priority under 35 USC §119(e) to U.S. Provisional Application Ser. No. 60/380,274, filed on May 15, 2002, and titled "Vapor Heat Sink," the entire contents of each are hereby incorporated by reference.

TECHNICAL FIELD

This application relates to cooling devices, and more particularly, to vapor augmented heat transfer devices.

BACKGROUND

As electronic components and devices get smaller with increasing operational speed, generated heat becomes a major obstacle of improving performance of electronic devices and systems. A heatsink is a common device used to remove heat from a heat-generating device to the ambient environment.

In many applications, heat generated from an electronic device can be ejected into the air by heatsinks. Development of heatsinks has been a major focus of thermal management in electronic systems. The performance of a heatsink can be represented by a total thermal resistance. A lower resistance value represents a higher cooling/heat transfer performance. Conductive resistance and convective resistance can affect the total thermal resistance of a heatsink. Conductive resistance represents the ability of a heatsink to diffuse heat from contact point with the heat source to convective surfaces. In general, conductive resistance can be minimized by having a short thermal conduction path with a large cross-section area with highly conductive material, e.g., aluminum or copper. Convective resistance represents the ability of a heatsink to eject heat into the ambient environment with a given air flow configuration. In general, heatsink designs maximize the number of convective surfaces.

Heat pipes can be used to reduce conductive resistance, since evaporated vapor carries heat from the evaporation zone and releases the heat by condensation over the condensation surface. For instance, a flat-plate heatpipe has been used to reduce the spreading resistance at the base of a heatsink. Also, fins, which are heatpipes arranged in an array configuration, thermally connected with a solid base, can minimize conductive resistance along the fins. A flat-plate heatpipe can be combined with other heatpipes to form a base and fins.

SUMMARY

A heatpipe heatsink includes a heatsink in which both the fins and the base can be inter-connected heatpipe chambers. Such a heatpipe heatsink can directly contact semiconductor chips, a bottom portion of the base chamber can be a flexible, thermally conductive sheet to provide good contact with surfaces of the chips. Inter-connected chambers of a heatpipe heatsink can be formed of ceramic material. The ceramic material can form the body with a porous structure and an impermeable layer can cover the porous ceramic body. Ceramic material can provide a more uniform interconnected pore structure for the wick. Alternatively, a heatpipe heatsink can be made by hot-pressing or sintering metal powders and over-molding a thermally conductive polymer. The fin chambers can have a pin array configuration for convective heat transfer. Inter-connected chamber heatpipe heatsink for a semi-conductor package can include channels as the wick structure. Channel wicks can be used in a heatpipe heatsink with an array of tapered-hollow-pin fin chambers.

The wicking structure of a heatpipe heatsink is functionally different from that of a more traditional heat pipe. In particular, the vapor and liquid flow of a more traditional heatpipe is generally one-dimensional, while in a heatpipe heatsink the vapor, liquid flow is more like three-dimensional. As such, the mass flow rate of the condensed liquid spatially varies in a heatpipe heatsink, but not in a more traditional heatpipe. Consequently, a modified wick structure can be used. A heatpipe heatsink with a modified wick structure can further reduce its thermal resistance.

A vapor-augmented heatsink can provide high thermal performance by using a wick structure which considers the three-dimensional characteristics of vapor and liquid flows within the heatpipe chambers and by using the heatpipe chamber and the solid convective element to minimize convective resistance.

The heat transfer rate across a heatpipe chamber directly contributes to the conductive resistance of the vapor-augmented heatsink. The heat transfer rate can be limited by the vapor flow rate and liquid flow rate. Since the performance of heatpipe chambers relates to three-dimensional fluid flows, the internal configuration can accommodate three-dimensional vapor flow and the three-dimensional liquid flow. Regarding the liquid flow, as the vapor augmented heatsink is intended for the electronic market, the heating (evaporation) zone typically has a high heat flux factor. Coupled with the size of the vapor augmented heatsink, having a high heat flux factor creates an illusion of needing a wicking structure with high wicking-power, while providing sufficient lift in relation to the size of the device. In general, wicking structures that can sustain both high flow-rate and provide large lift are difficult to achieve. However, in reality, only the heating (evaporation) zone has a high wicking-power factor, and the wicking power factor reduces with increasing distance from the heating zone. Specifically, condensation occurs at a significantly reduced heat-flux, and a high condensation flow rate is needed only at the evaporation site where the condensate converges together. Therefore, the wicking structure can vary according to the spatial flow rate requirement in order to better balance the forces (i.e., capillary force, viscous force, and gravitational force) acting on the liquid. Furthermore, the condensed liquid can flow back to the evaporation zone through three-dimensional multiple liquid-flow-paths, thereby shortening the travel distances. These factors allow for the use of variable wicks with variable wicking structures and/or variable thickness in the wicking structure.

Concerning the three-dimensional vapor flow, the vapor needs to be spread across the chambers. In general, the cross-sectional dimensions of the vapor cavity should be sufficiently large. However, a smaller overall chamber size is required for allow more convective surface area. Therefore, a thinner wick layer can provide a larger vapor cavity inside the chamber. With a varying wick structure, the thickness of the wick layer can be thinner at locations other than the evaporation zone. For example, the fin chamber can have a thinner wick structure since the amount of condensed liquid is less there than at the location close to the evaporation zone. As a result, the overall performance of the vapor-augmented heatsink can be improved by considering both the convective resistance and the conductive resistance.

In addition, in order to reduce the total thermal resistance of heatpipe heatsinks, solid convective fins can be used. Since the thickness or the size of a solid convective fin is generally smaller than that of a heatpipe chamber, the convective resistance can be reduced by using solid fins in a configuration to increase the total number of convective surfaces with a small temperature variation over the convective surfaces. In order to obtain a convective surface with smaller temperature variation, at least one side of a solid fin can thermally contact the heatpipe chambers.

In addition to internal operations, the fin(s) of the vapor-augmented heatsink can be configured to further reduce convective resistance. Specifically, in a typical heatsink, the base of the solid fin(s) serves to conduct heat away from the base toward the tip of the fin(s), which, in a channel configuration, increases the pressure drop in the air and thus diminishes the ability of the air to remove the heat. However, in a vapor-augmented heatsink, heat can be transported away from the base through vapor condensation, and as a result, opening(s) can be created on the solid fin(s). The opening(s) can reduce the pressure drop in the air and can increase the convective heat transfer similar to that of a pin-grid array or porous configuration.

The chambers can be formed by a material removal process, such as machining and electro-discharge-machining; or a material transforming process, such as stamping, drawing, casting, molding, folding, laminating, sintering, or jointing of preformed elements; or another material forming process known in the art. The wick structure on the inner wall of the device can be formed (for example, by molding or by lamination) at the same time as the chamber. Alternatively, the wick structure can also be formed separately by processes that are known in the art, for example, by inter-connective process, such as mesh formed by wires, sintering of powders, or powders with bonding material; or material forming process, such as plating or coating, or porous foam forming; or material removal process, such as machining or etching; or combinations of processes that are known in the art. The solid convective elements can be formed at the same time as the formation of the chamber. Alternatively, the convective elements can also be formed separately by material forming processes, such as casting, molding, stamping, or machining, or other material forming or removal processes that are known in the art. The thermal connection between the separately formed convective elements and the chamber can be done by material connection processes with or without interfacial bonding material, such as soldering, brazing, welding, thermal activated bonding, sonic activated bonding, pressure activated bonding, adhesive bonding, or other process known in the art. Working liquid can be introduced into the chamber before the chamber is hermetically sealed. Furthermore, the condition inside the chamber can allow evaporation of the working fluid at a temperature between its freezing condition and critical condition.

In a general aspect, a heat transfer device includes at least one base chamber, at least one fin chamber, and at least one fin. The chambers can be thermally coupled and adapted to hold condensable vapor.

The implementation of the heat transfer device may include one or more of the following features. The heat transfer device can include at least one fin that is solid. The fin can have at least one side and be in thermal contact with at least one the base and fin chambers. The fin can be formed of thermally conductive material.

The heat transfer device can include at least one vapor path.

The heat transfer device can also include a wick structure. The wick structure can be formed integrally with a wall of the chambers. Alternatively, the wick structure can be formed separately from a wall of the chambers. The wick structure can include a multi-wick structure, a three-dimensional wick structure, or a spatially varying wick structure.

The multi-wick structure can include at least one bridging wick structure to provide multiple liquid-flow-path. Alternatively, the multi-wick structure can include a combination of a groove, a mesh, an aggregated powder wick, or a foam wick. Or, the multi-wick structure can include a combination of a layered structure, a bar structure, or a bridging wick structure. In another alternative, the multi-wick structure can include a wick structure with varying porosity or varying pore size. The wick can have a varying cross-sectional geometry or varying dimensions.

The wick structure can include a spatially varying wick structure. The spatially varying wick structure can be a groove structure with a spatially varying pattern.

Alternatively, the wick structure can include an aggregated powder wick, a foam wick, at least one groove, or a mesh wick. The wick structure can include a layered structure.

The heat transfer device can further include a wick structure adapted to store liquid so as to accommodate a liquid flow variation.

The heat transfer device can further include a wick structure is disposed between opposing walls of a chamber.

The heat transfer device can further include at least one internal supporting structure to avoid collapsing of chambers. The internal supporting structure can include at least one solid element. Alternatively, the internal supporting structure element can include a wicking structure.

The fin of the heat transfer device can include at least one opening. The opening can define a plurality of geometries. Alternatively, the opening can define a plurality of dimensions.

The fin of the heat transfer device can include an opening in an airflow downstream portion.

The fin of the heat transfer device can include a cut-out on a side. The cut-out can define a plurality of geometries. Alternatively, the cut-out can define a plurality of dimensions. In another alternative, the cut-out can define a slit. The side with the cut-out can thermally contact at least one of the base chamber and the fin chamber.

The at least two fins of the heat transfer device can include two interconnected fins. The two interconnected fins can be connected by a baffle. The heat transfer device can further include at least one phase change element. The chambers of the heat transfer device can form an inverted T-shape, a double inverted T-shape, a U-shape, or a W-shape.

The details of one or more embodiments are set forth in the accompanying drawings and the description below. Other features will be apparent from the description and drawings and from the claims.

DESCRIPTION OF DRAWINGS

FIG. 1B is a cross-sectional view of the vapor-augmented heatsink of FIG. 1A, along section A-A. showing one view of an embodiment of a mesh wicking structure.

FIG. 1C is a cross-sectional view of the vapor-augmented heatsink if FIG. 1A, along section B-B, showing another view of the embodiment of the mesh wicking structure of FIG. 1B.

FIG. 5A is a sectional view of a fifth embodiment of another multi-wick wicking structure of the vapor-augmented heatsink of FIG. 1A, taken along section A-A.

FIG. 5B is a sectional view of the fifth embodiment of the multi-wick wicking structure of the vapor-augmented heatsink of FIG. 1A, taken along section B-B.

FIG. 5C is a sectional view of the fifth embodiment of the multi-wick wicking structure of the vapor-augmented heatsink of FIG. 1A, taken along section C-C.

FIG. 11A is a sectional view of the multi-wick wicking structure of the vapor-augmented heatsink of FIG. 1A taken along section A-A with a wick having a spherical shape.

FIG. 11B is a sectional view of the multi-wick wicking structure of the vapor-augmented heatsink of FIG. 1A, taken along section B-B with a wick having a plurality of shapes.

Like reference symbols in the various drawings indicate like elements.

DETAILED DESCRIPTION

Figure 1A:
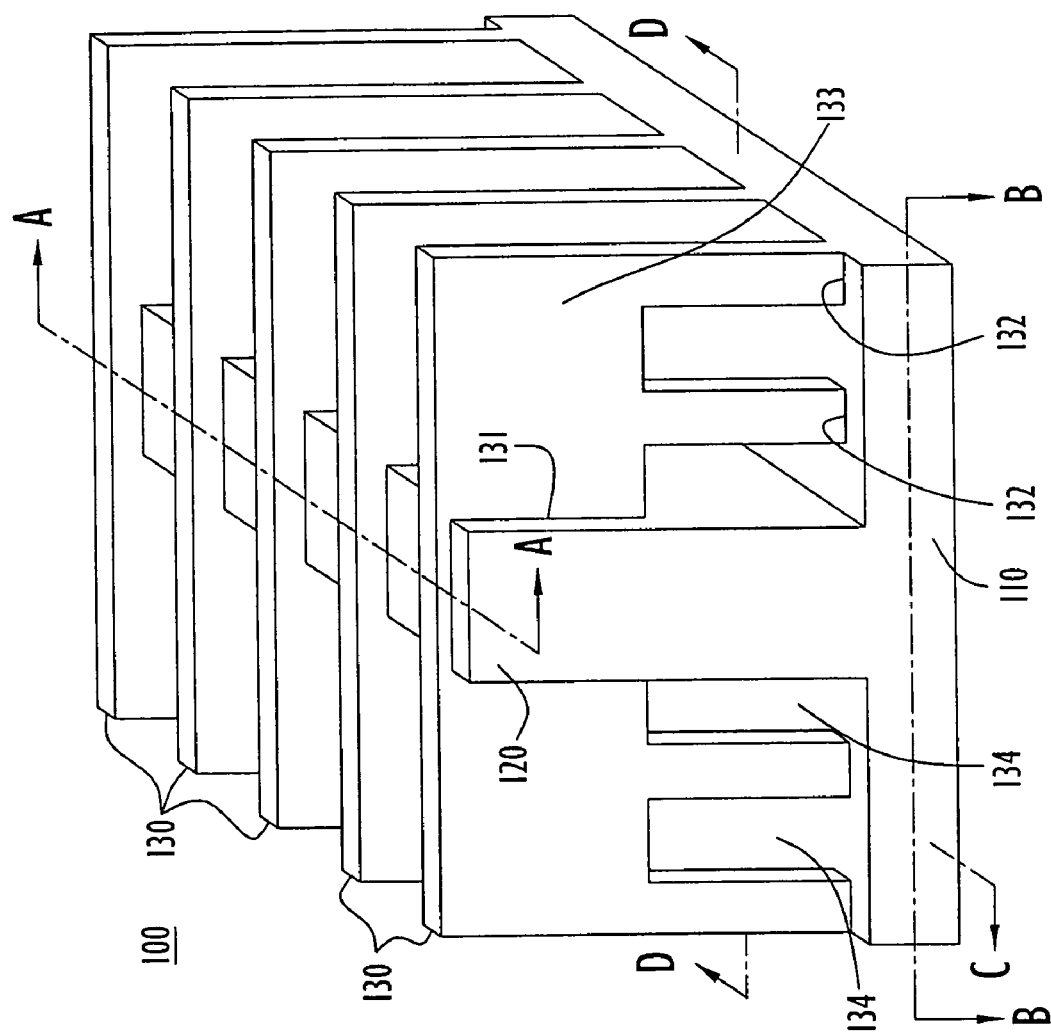
FIG. 1A is an isometric view of a vapor-augmented heatsink with an inverted "T" heatpipe chamber.

Referring to FIG. 1A, a vapor-augmented heatsink 100 includes a base chamber 110, a fin chamber 120, and solid fins 130. The fins 130 and the heat source contact portion 103 (see FIG. 1B) of the base chamber 110 can be made of thermally-conductive material, such as copper or aluminum, while another remaining portion 103, 104 of the base chamber 110 and other chambers can be made of a solid material, such as metals, ceramics, and plastics, depending on application requirements. The base chamber 110 can absorb heat from the heat source 101 (as shown in FIGS. 1B and 1C), such as an electronic device. The heat can evaporate the liquid inside the base chamber 110. Vapor can be generated and can carry the heat to other surfaces of the base chamber 110 and surfaces of fin chamber 120 by condensation. The distributed heat can be diffused into the fins 130 and eventually, convected into the ambient environment by airflow over the fins 130. Wire mesh wick structures 119, 129 can be applied over the internal walls 102 of the fin chamber 120 and the base chamber 110, respectively. The condensed liquid can be pulled back to the evaporation zone or heat source contact portion 103 by capillary force along the wicks 119, 129. Generally, both base chamber 110 and fin chamber 120 are under vacuum pressure so that internal supporting structure(s) (not shown) prevent collapse of the chambers 110, 120. The supporting structure(s) can include wicking structures. Besides the reduction of conductive resistance, convective resistance can be reduced by fin design. Each solid fin 130 conducts heat from two sites, the contact 131 with the fin chamber 120 and the contact 132 with the base chamber 110, to provide more uniform temperature convective surfaces 133 on the fin 130 for improved heat dissipation. Furthermore, openings 134 at the lower part of the fin can provide an additional impingement effect on the base as air flows downward and can reduce the back pressure and pressure drop for the airflow. As a result, a large portion of the airflow can pass through the fins and along the base without escaping the heatsink halfway through before reaching the base chamber 110. Better flow ducting effect can be achieved by adding baffles (not shown) at the sides of the fins to guide the airflow downward.

Figure 2A:
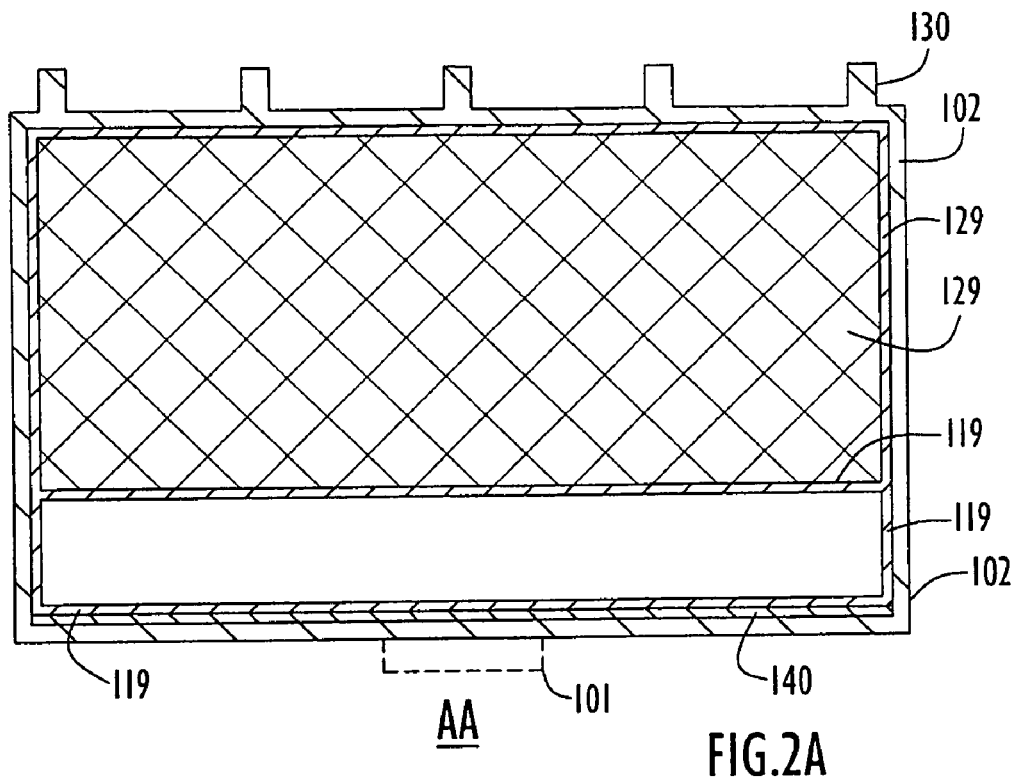
FIG. 2A is a sectional view of the embodiment of a multi-wick wicking structure with a special groove on the bottom plate of the vapor-augmented heatsink of FIG. 1A taken along section A-A.
Figure 2B:
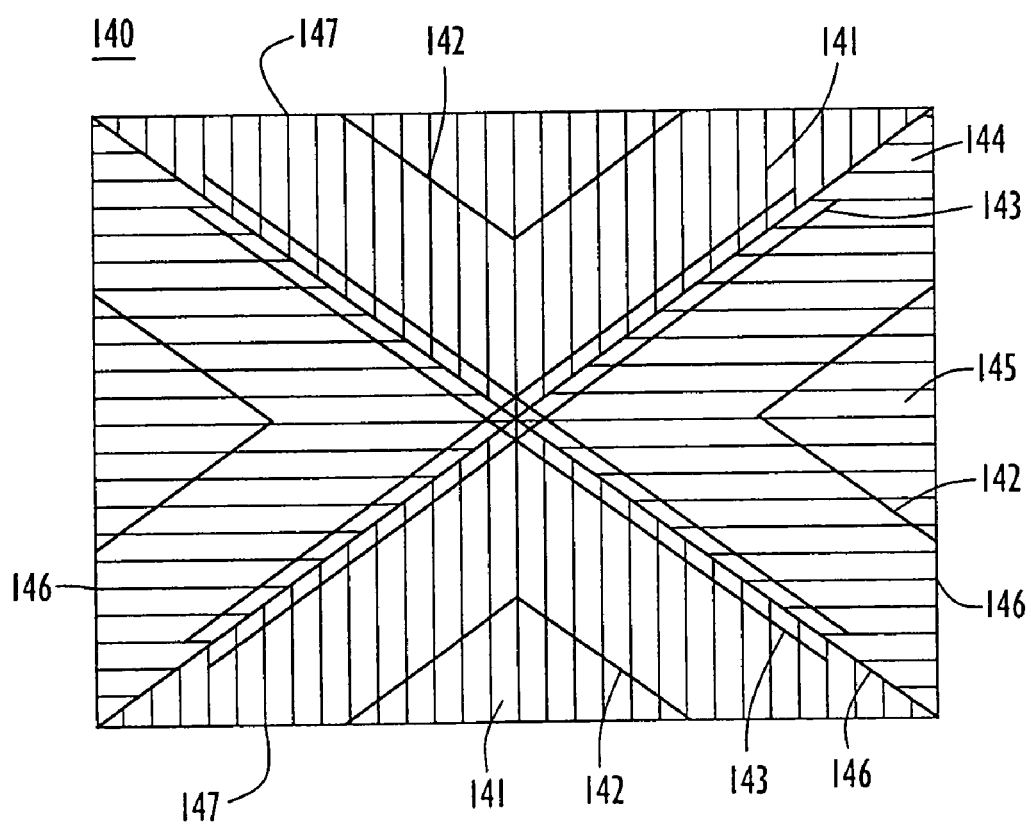
FIG. 2B is a sectional view of the embodiment of a multi-wick wicking structure with a special groove on the bottom plate of the vapor-augmented heatsink of FIG. 1A, taken along section B-B.
Figure 3:
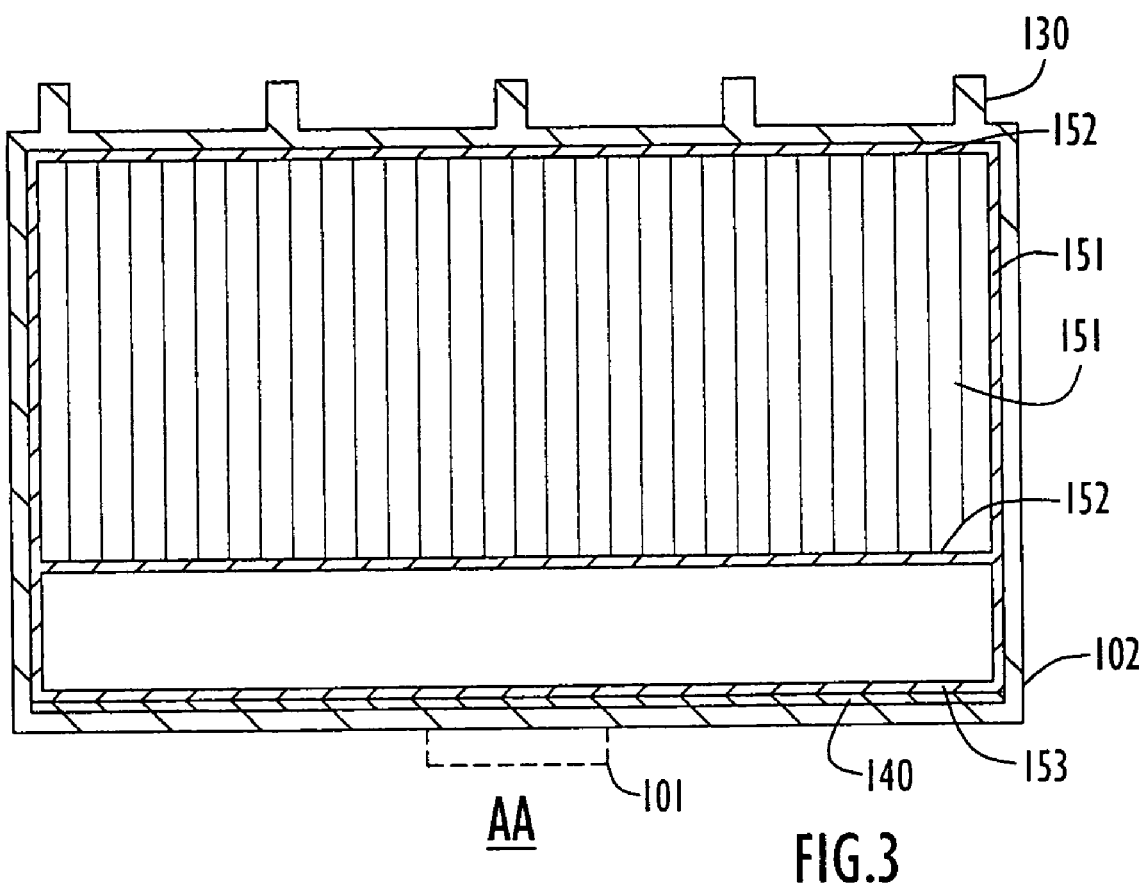
FIG. 3A is a sectional view of a third embodiment of a grooved wicking structure with mesh layer on the bottom plate of the vapor-augmented heatsink of FIG. 1A, taken along section A-A.

To optimize liquid flow and vapor flow, a spatially varying wick structure can be used. In general, the liquid flow rate along the base chamber 110 is higher than that along the fin chamber 120. A wicking structure at the bottom portion of base chamber 110 can include a groove structure 140 applied on the bottom plate of the base chamber 110 so that the wicking-power along the bottom plate can converge the liquid toward the evaporation zone 103, as shown in FIGS. 2A and 2B. The major grooves 141, 145 channel liquid away from the sides 146, 167. Grooves 142, 143, 144 bridge the liquid across grooves 141 and 145 and pull the liquid toward center. By putting a mesh structure 119 on top of this groove structure layer 140, the condensed liquid can be pulled back to the evaporation zone at the center. Instead of using mesh, groove structures 151, 152 can be applied over the internal walls. Referring to FIG. 3, vertical grooves 151 and horizontal grooves 152 can be provided inside the fin chamber 120, while horizontal grooves 152 and groove structure 140 can be provided inside the base chamber 110. In order to provide a higher wicking-power along the bottom portion of the base chamber 110, a mesh layer 153 can be applied to groove structure 140.

Figure 4A:
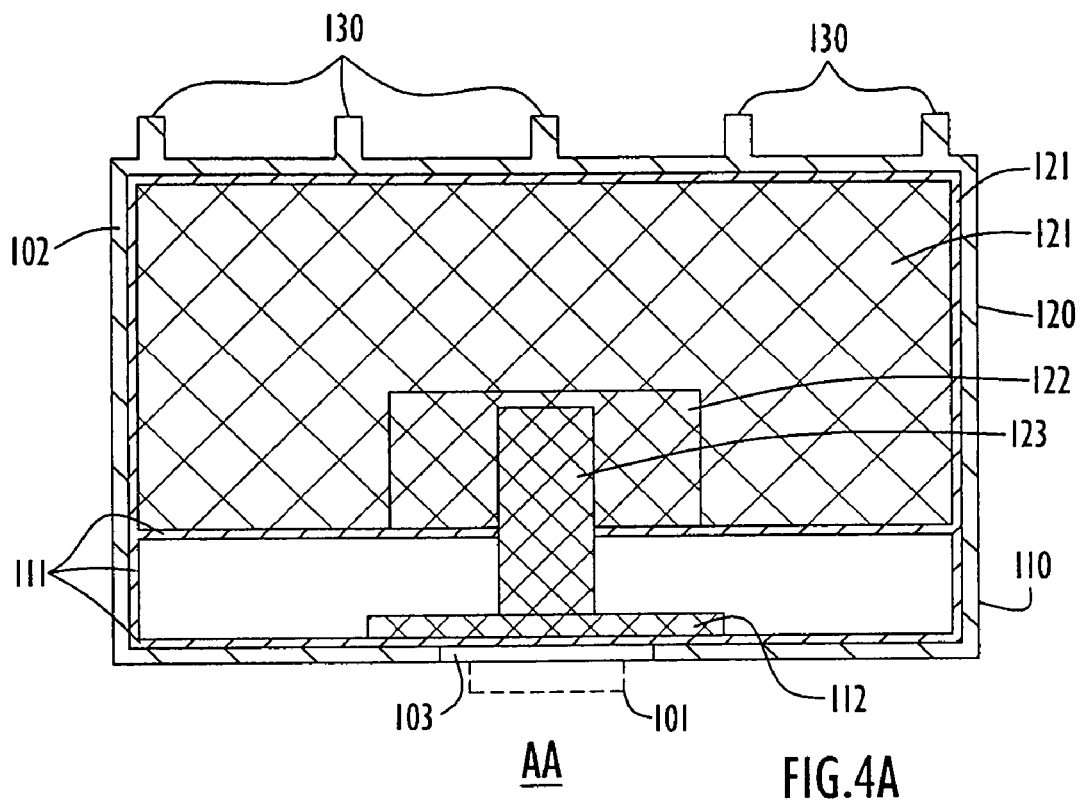
FIG. 4A is a sectional view of a fourth embodiment of a multi-wick wicking structure of the vapor-augmented heatsink of FIG. 1A, taken along section A-A.
Figure 4B:
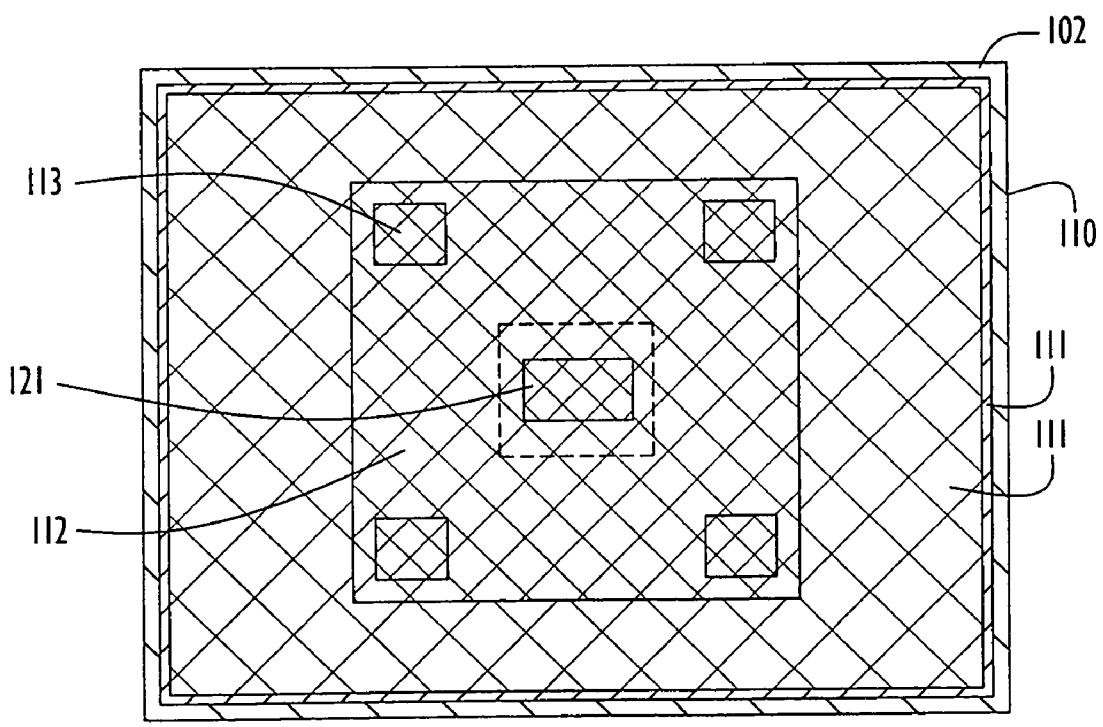
FIG. 4B is a sectional view of the fourth embodiment of the multi-wick wicking structure of the vapor-augmented heatsink to shown one

For higher heat dissipation, a more complex multi-wick structure, such as the wick structure configuration shown in FIGS. 4A and 4B, can be used. Since the distribution of heat is by condensation of generated vapor, the condensed liquid can also be distributed over the internal surfaces of chambers 110 and 120. The condensed liquid can be pulled along the wick structure layers 111 and 121, which contact with the chamber walls 102, by capillary force back to the evaporation zone 103. Since the heat flux can be significantly reduced by the heat spreading effect, the liquid flow rate can be relatively low that an ordinary wicking-power structure, such as wire mesh, can be used. As the liquid is pulled closer to the evaporation zone 103, the flow rate can increase since the liquid converges from a large surface area to a smaller evaporation area. Therefore, at most of surfaces, only an ordinary wick structure (e.g., wire mesh, grooves, sintered powder layer, or foam structure layer) can be applied for the wick layers 111, 121 and can pull the liquid flow toward the evaporation zone 103. On the other hand, at regions 112, 122 close to the evaporation zone, a higher wicking-power structure, such as many layers of wire mesh, grooves, powders, foam structure, or a combination thereof, can be used. Additionally, wick structure bridges 113, 123 can also be applied within chambers 110, 120 to provide a short distance with three dimensional multiple liquid-flow-paths for the liquid flow back to the evaporation zone 103 instead of flowing along only internal surfaces. The structure of the wick structure bridges 113, 123 (the three-dimensional multiple liquid-flow path wick structures) can be a higher wicking-power structure, such as many layers of wire mesh, grooves, powders, foam structure, or a combination thereof. These bridges may also be combined with structural columns (not shown) to provide the necessary supporting functions. Vapor flow can affect heat distribution over the chamber surface. As the vapor flows through the vapor cavity of the chambers, there can be significant temperature difference between the evaporation zone 103 and the condensation surfaces if the pressure drop along the vapor flow path is large. If a wider vapor cavity can be used with a thinner wick structure, the resulting pressure drop can be reduced so that a final condensation temperature at the chamber surface can be close to the temperature at the evaporation zone 103. As a result, the overall high heat dissipation performance can be increased.

Referring to FIGS. 5A, 5B, and 5C, another multi-wick structure includes an ordinary wick structure layer 111 on the bottom surface of the base 110 and a high wicking-power structure layer 112 in the region close to the evaporation zone 103. A high wicking-power structure can also be used for the wicking layer 115 around the sides of the base, as shown in FIG. 5B. Another high wicking-power structure bar 116 at the middle and across the base, perpendicular to the fin chamber 120 can be included. Both high wicking-power structure layer 115 and high wicking-powered structure bar 116 can be the height of the vapor chamber so that the layer 115 and bar 116 can serve as wicking bridges (the three-dimensional multiple liquid-flow-path wick structure) between the top surface and the bottom surface of the base 110. Another high wicking-power structure bar 114 can cross the base, perpendicular to the wicking bar 116 at the middle of the base. The height of wicking bar 114 can be less than the height of the chamber so that a gap 105 can be created for vapor flow. The wicking layer 115 along the side can channel the condensed liquid around the side of the base 110 to the ends of the wicking bars 114, 116. Wicking bars 114, 116 can share the total mass flow of liquid and pull the liquid back to the evaporation zone 103. Similarly, wicking layer 125 can be applied along the side of the fin chamber 120 and the bridging and channeling wicking bar 124 can be applied at the middle of the fin chamber 120 from top to the bottom, as shown in FIG. 5A.

Figure 6A:
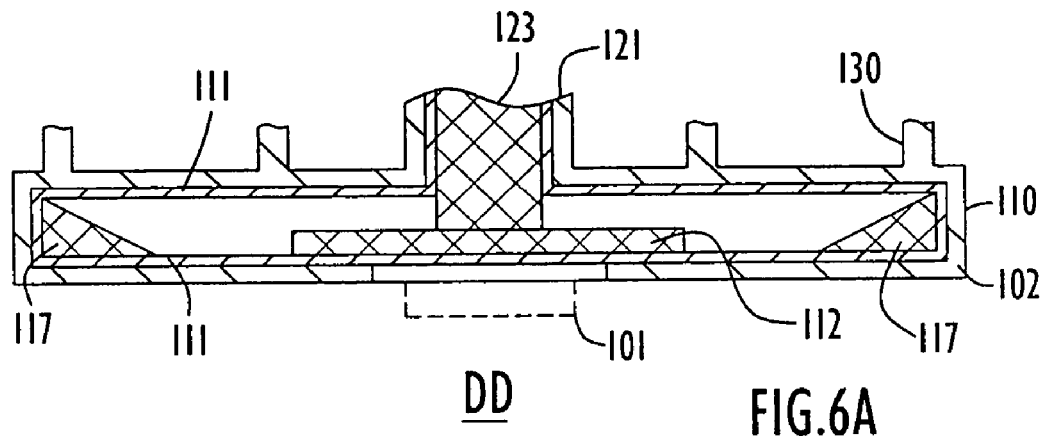
FIG. 6A is a sectional view of the vapor-augmented heatsink of FIG. 1A, showing a wick configuration with liquid reservoirs, taken along section D-D.
Figure 6B:
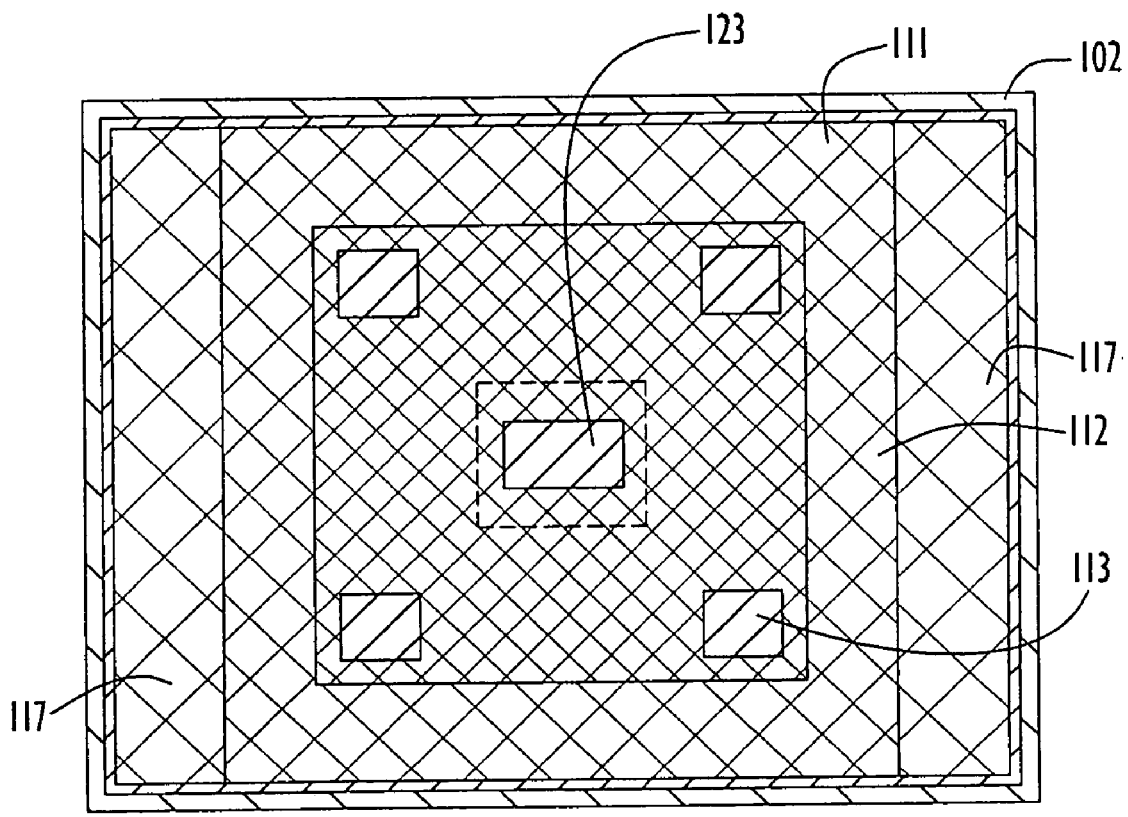
FIG. 6B is a sectional view of the vapor-augmented heatsink of FIG. 1A showing the wick configuration with liquid reservoirs, taken along section B-B.

Heat source 101 can dissipate heat into the base chamber 110. In a steady state situation, the amount of power dissipating is relatively constant so that the amount of vapor generation is also constant. In normal operating conditions, the condensed liquid flow back to the evaporation zone is constant and equal to the mass evaporation rate in order to maintain the balance of the heat of evaporation and the heat input from the heat generating electronic device 101. However, in some electronic device applications, the heat dissipation rate is not steady and varies rigorously. If the heat dissipation rate suddenly increases, the required increment of the liquid flow may not be matched immediately. As a result, the equilibrium temperature of the evaporation zone 103 can shift so that the device may over-heat due to drying-out. Liquid reservoirs 117 can be introduced at the far end of the base chamber, as shown in FIGS. 6A and 6B. The reservoirs 117 can hold an amount of liquid, which can be pulled toward the evaporation zone 103 since the wicking-power of the reservoirs 117 is relatively low in comparison to ordinary wick 112.

Figure 7A:
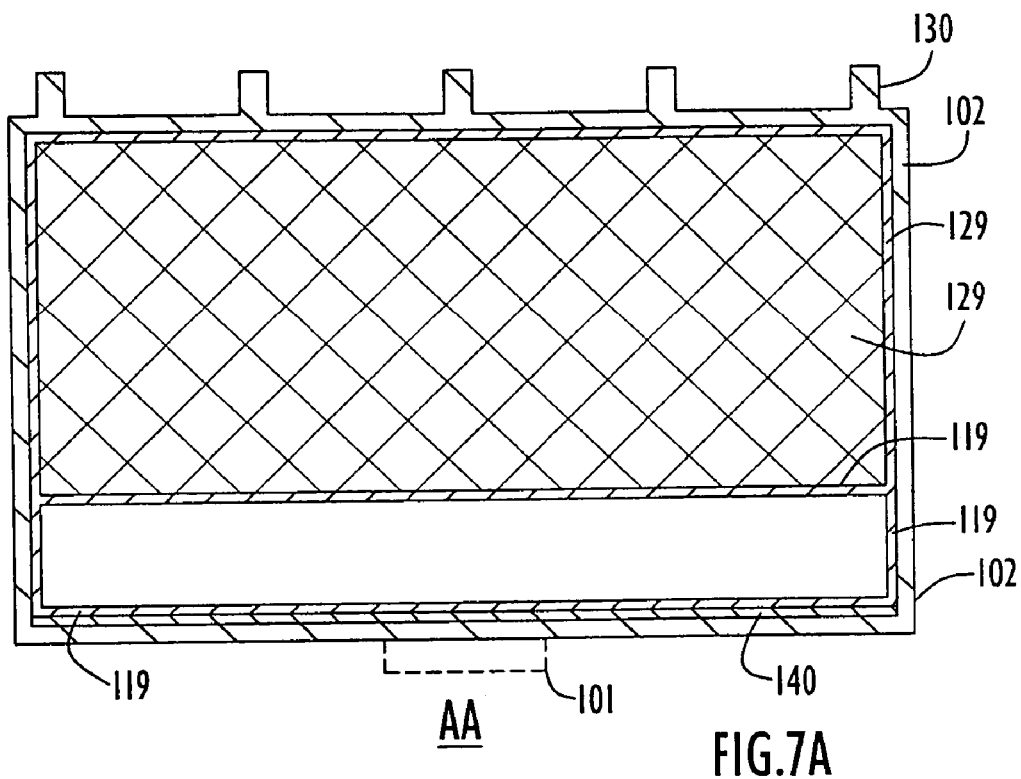
FIG. 7A is a sectional view of the vapor-augmented heatsink of FIG. 1A, showing the wick configuration with solid-liquid phase change elements, taken along section A-A.
Figure 7B:
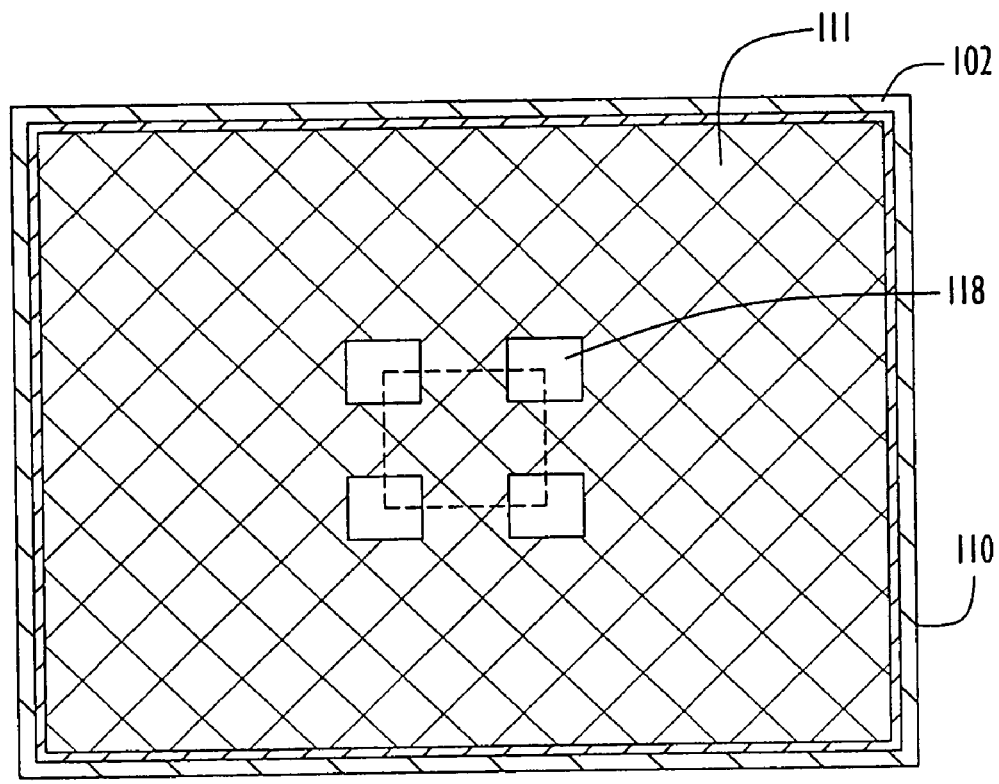
FIG. 7B is a sectional view of the vapor-augmented heatsink of FIG. 1A, showing the wick configuration with solid-liquid phase change elements of FIG. 7A, taken along section B-B.
Figure 8A:
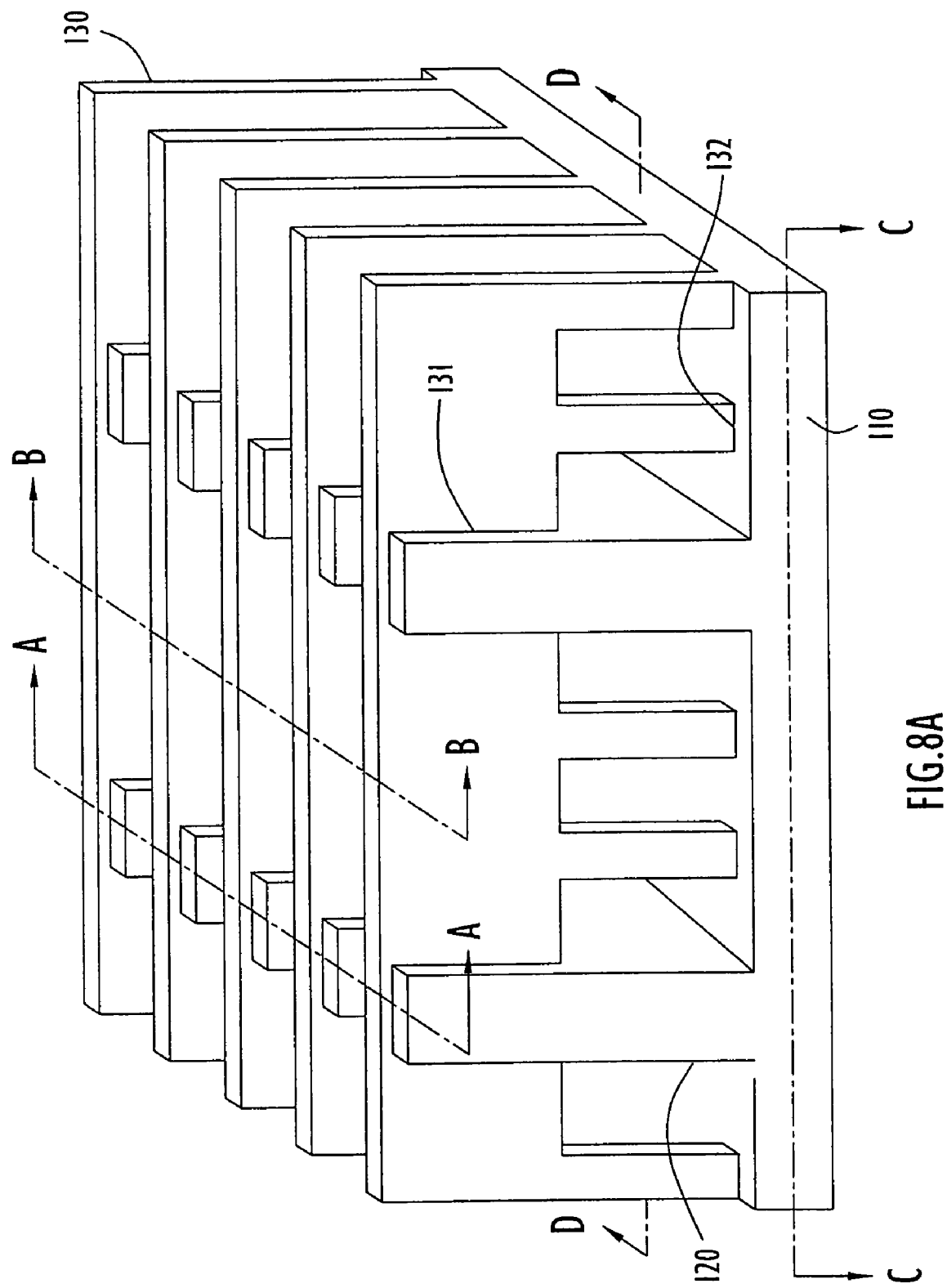
FIG. 8A is an isometric view of a vapor-augmented heatsink with a double inverted "T" heatpipe chamber.
Figure 8B:
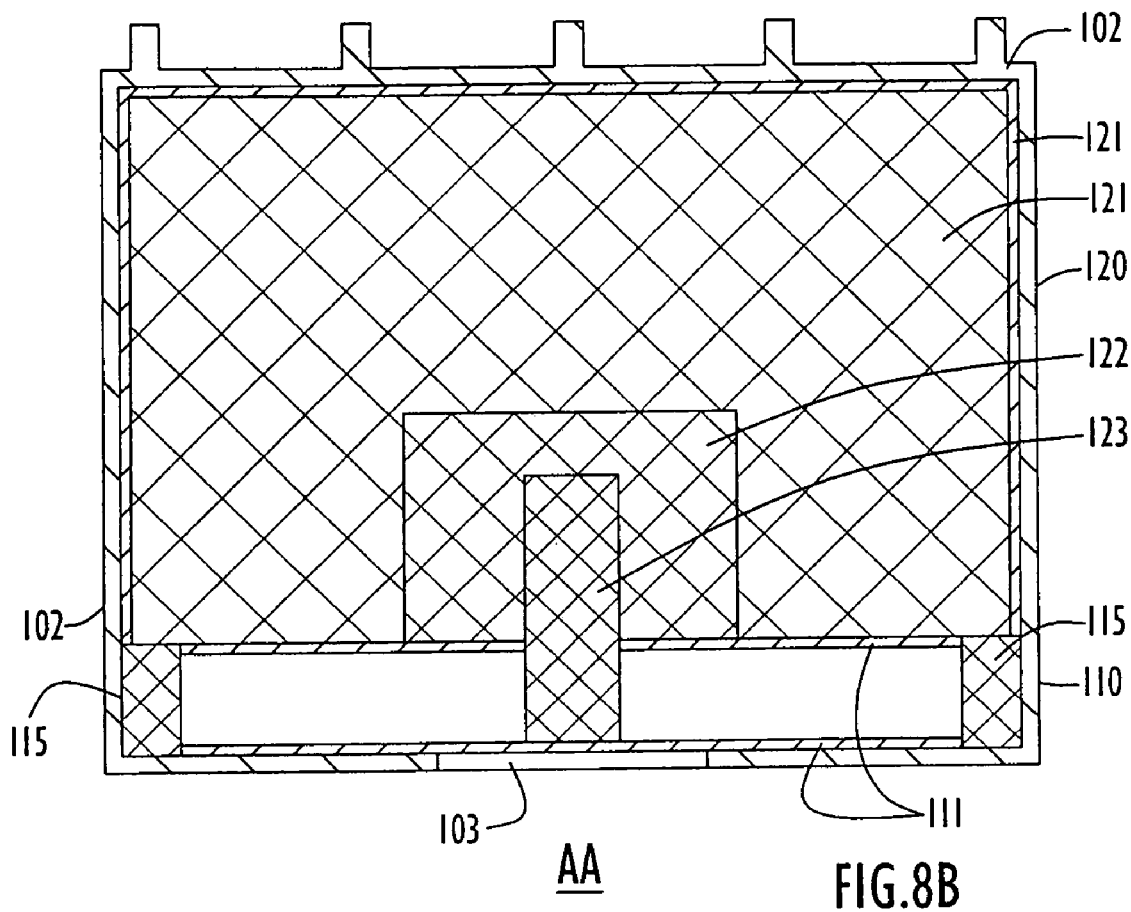
FIG. 8B is a sectional view of the vapor-augmented heatsink with a double inverted "T" heatpipe chamber of FIG. 8A taken along section 8B-8B.
Figure 8C:
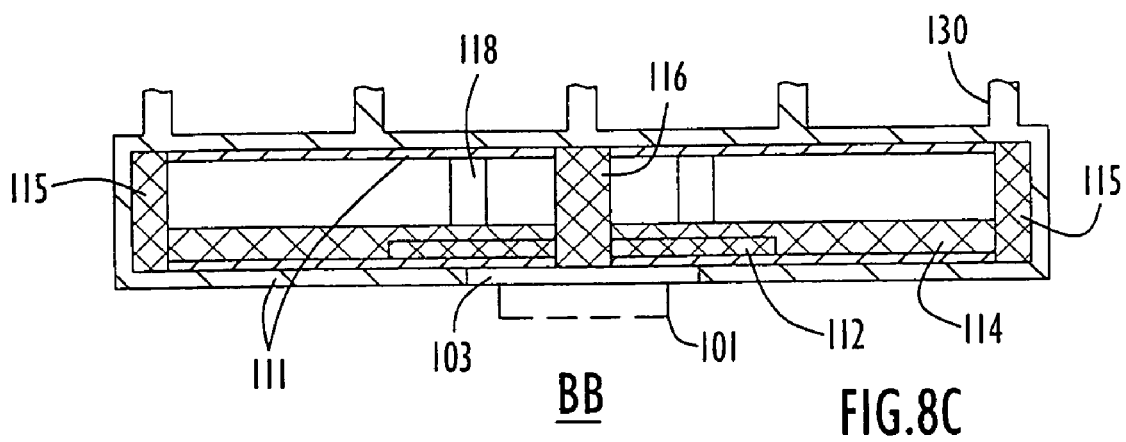
FIG. 8C is a sectional view of the vapor-augmented heatsink with a double inverted "T" heatpipe chamber of FIG. 8A taken along section 8C-8C.
Figure 8D:
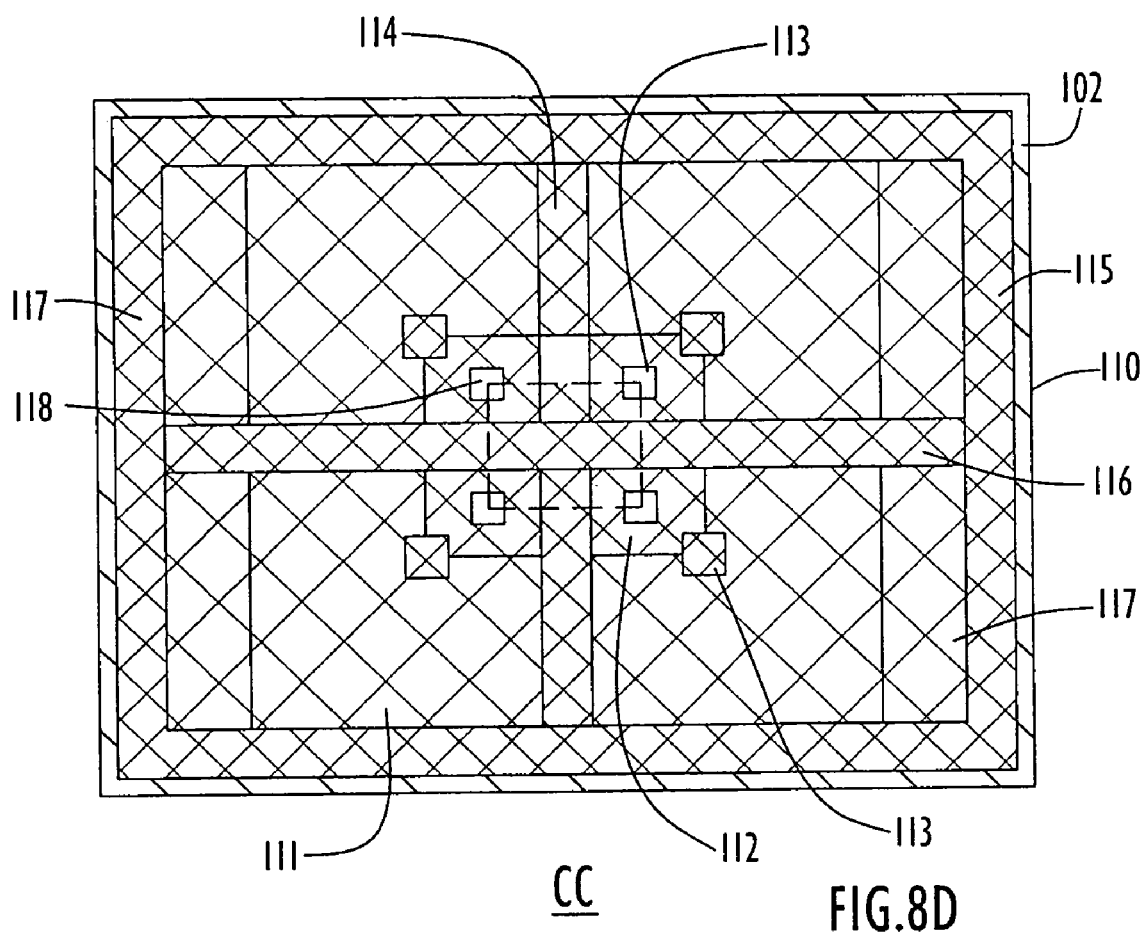
FIG. 8D is a sectional view of the vapor-augmented heatsink with a double inverted "T" heatpipe chamber of FIG. 8A taken along section 8D-8D.
Figure 8E:
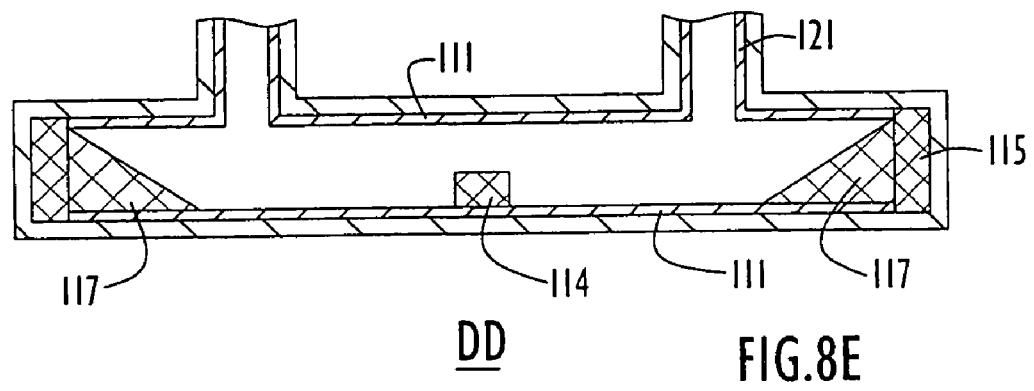
FIG. 8E is a sectional view of the vapor-augmented heatsink with a double inverted "T" heatpipe chamber of FIG. 8A taken along section 8E-8E.

Referring FIGS. 7A and 7B, solid-liquid phase change elements 118 can be used to prevent drying-out due to a sudden increase of heat dissipation from the heat source 101. The phase change elements 118 can be small containers in which solid-liquid phase change materials can be disposed. The phase change material can be specifically selected to limit the evaporation zone temperature at a predetermined temperature so that the melting temperature of the phase change material is below the maximum allowable temperature for the electronic device and higher than the normal running temperature of the vapor-augmented heatsink 100. When there is a sudden increase of dissipating heat from the electronic device, the evaporation rate can increase and the equilibrium temperature at the evaporation zone can increase. When the temperature at the evaporation zone reaches the melting temperature of the phase change material, the phase change element 118 can absorb heat by melting. As a result, the evaporation rate does not keep increasing so as to prevent dryout. When the heat dissipation rate decreases so that the absorbed heat can gradually be released to the liquid by re-solidification of the phase change element 118, the equilibrium at the evaporation zone 103 can shift back to the normal operating condition.

The geometry of the fin chamber 120 and base chamber 110 as previously described was a single inverted "T". In FIGS. 8A to 8E, the vapor-augmented heatsink includes a double inverted "T". The arrangement of the multi-wick structure is similar to that for the single inverted "T" configuration. Assuming the heat source 101 can be located at the center of the base 110 of the vapor-augmented heatsink 100, the heat can evaporate the liquid inside the chamber, vapor can be generated, and the vapor can carry the heat to other surfaces of base chamber and surfaces of the two fin chambers by condensation. The condensed liquid can be pulled along the wick structure layer 111 and 121 by capillary force. As the liquid is pulled closer to the evaporation zone 103, the mass flow rate can increase since the liquid can converge from a large surface area to a small evaporation area. Therefore, at most of the surfaces, an ordinary wicking structure, such as wire mesh, groove, sintered powder, foam structure, can be used for the wicking layers 111 and 121, and can pull the liquid. At the regions 112, 122 close to the evaporation zone 103, a higher wicking-power structure, such as many layers of wire mesh, grooves, powders, foam structure, any combination of them, can be used. In addition, additional wicking bridges 113, 123, which provide the three-dimensional multiple liquid-flow-path, can also be applied between the base surface and other surface to provide a shorter travel distance for the liquid flow back to the evaporation zone 103. The structure of the wicking bridges 113, 123 can be of a higher wicking-power structure, such as many layers of wire mesh, grooves, powders, foam structure, or a combination thereof. Additional high wicking-power elements 114, 115, 116 can be added around the sides of the base and across the base to enhance the liquid pulling back to the evaporation zone 103. Liquid reservoirs 117 and solid-liquid phase change elements 118 can be introduced to avoid dryout with an increase of dissipation power from the heat source 101.

Figure 9:
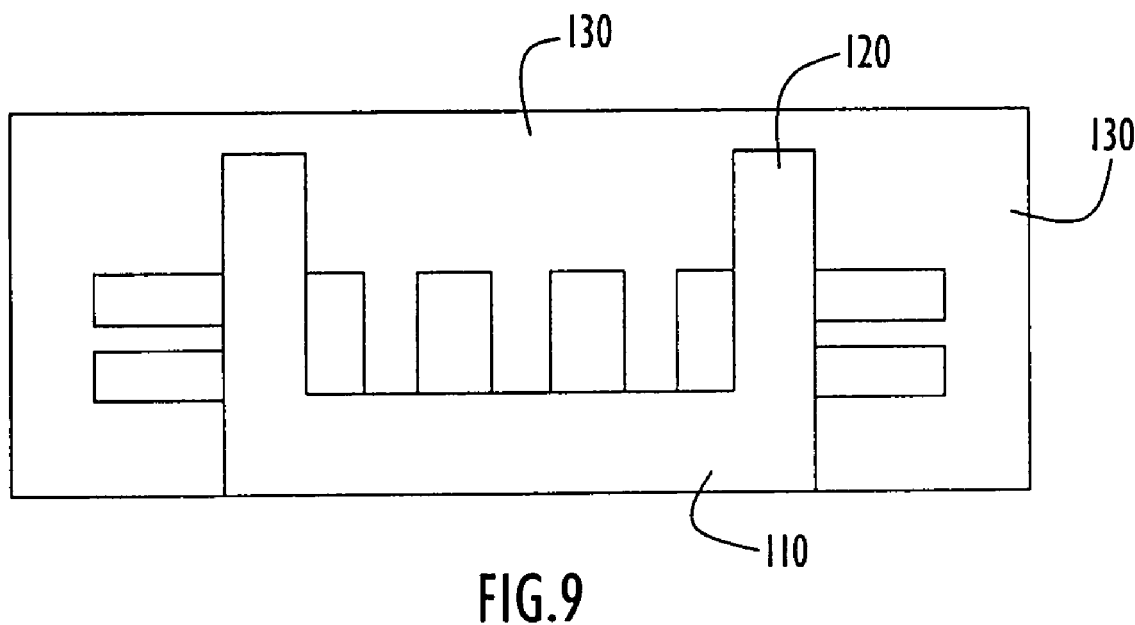
FIG. 9 is a front view of a vapor-augmented heatsink with a "U" heatpipe chamber.
Figure 10:
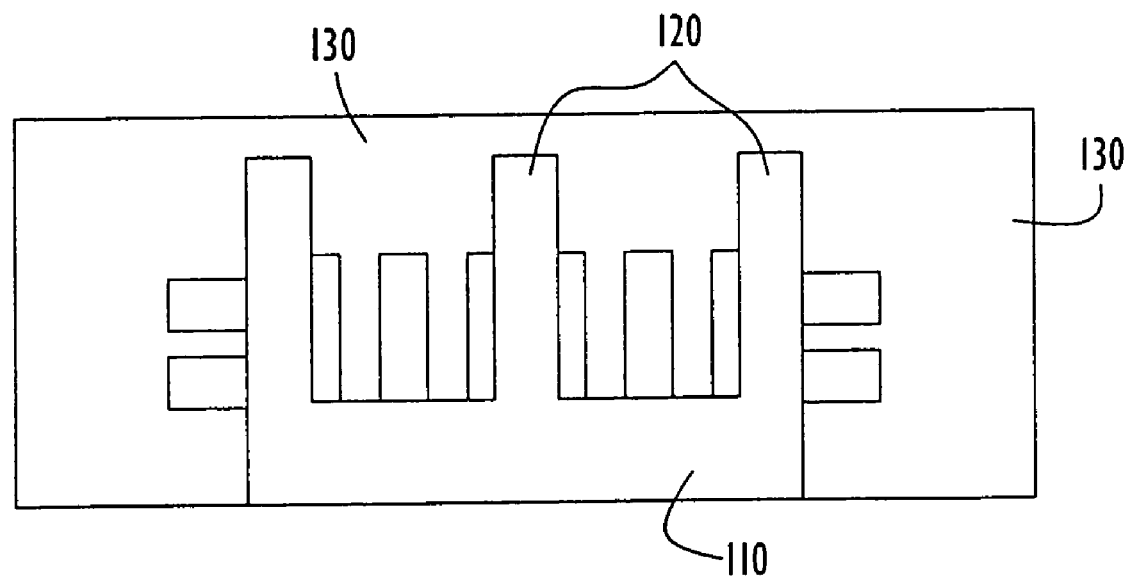
FIG. 10 is a front view of a vapor-augmented heatsink with a "W" heatpipe chamber.

In FIGS. 9 and 10, a "U" shape and a "W" shape, respectively, heatpipe chamber configuration can be included in the vapor-augmented heatsink. An internal multi-wick structure can follow the same principles as with the single inverted "T" and double inverted "T" heatpipe chamber configurations described above.

Referring to FIG. 11A, the multi-wick wicking structure 111 of the vapor-augmented heatsink includes a wick having a semi-circular shape 161.

Referring to FIG. 11B, the multi-wick wicking structure 111 of the vapor-augmented heatsink includes a wick having a plurality of shapes 123, 163.

Figure 12:
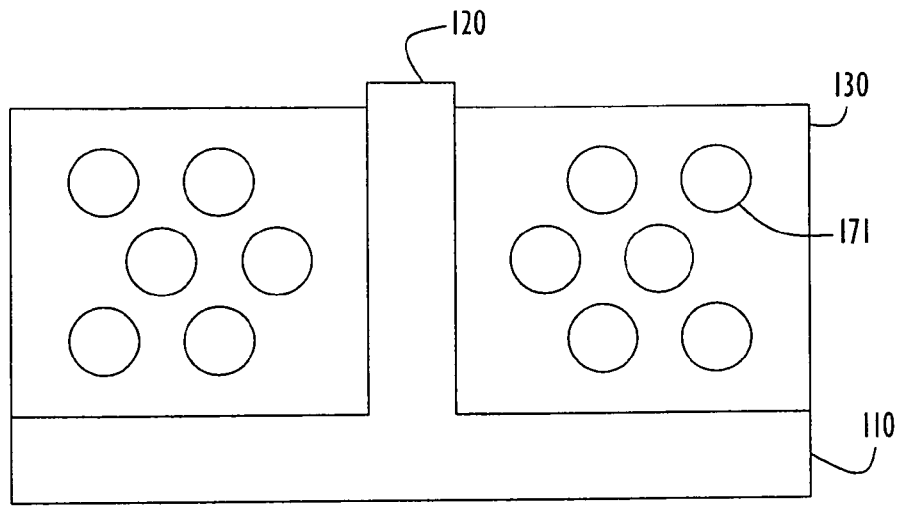
FIGS. 12-14 are side views of a fin including at least one opening of a vapor-augmented heatsink having a plurality of geometries and/or dimensions.
Figure 13:
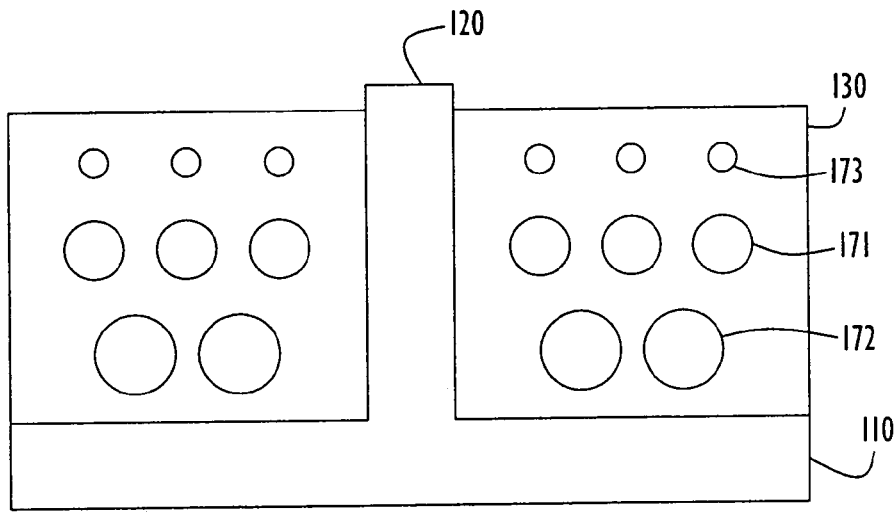
Figure 14:
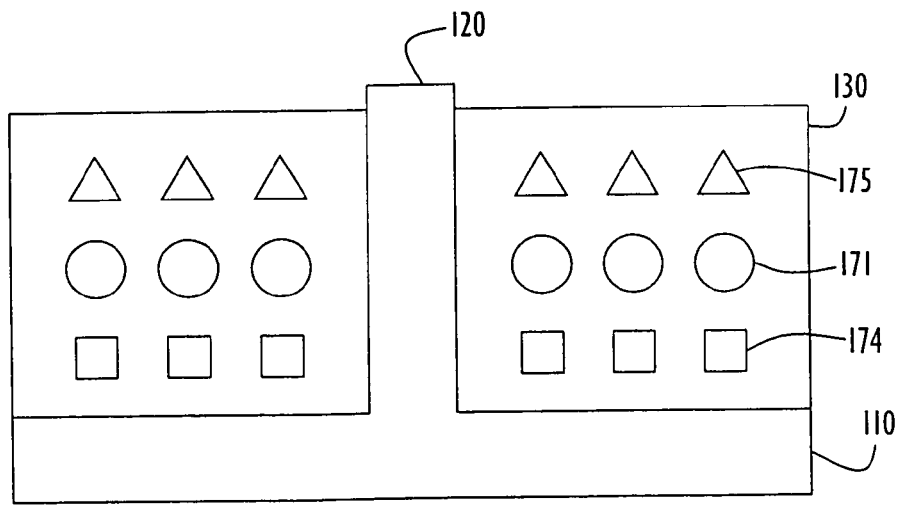

Referring to FIGS. 12-14, the fin 130 of the vapor-augmented heatsink can include at least one opening 171 having a plurality of geometries and/or dimensions. In FIG. 12, for instance, the openings 171 have the same shape (geometry), i.e., circular, and have the same dimensions, i.e., are of a similar size. In another example, in FIG. 13, the openings 171, 172, 173 again have the same shape (geometry), i.e., circular, but, the openings 171, 172, 173 vary in size (dimension), i.e., diameter. In yet another example, in FIG. 14, the openings 171, 174, 175 have different shapes (geometries), i.e., triangular, circular, and square, and vary in size (dimension).

Figure 15:
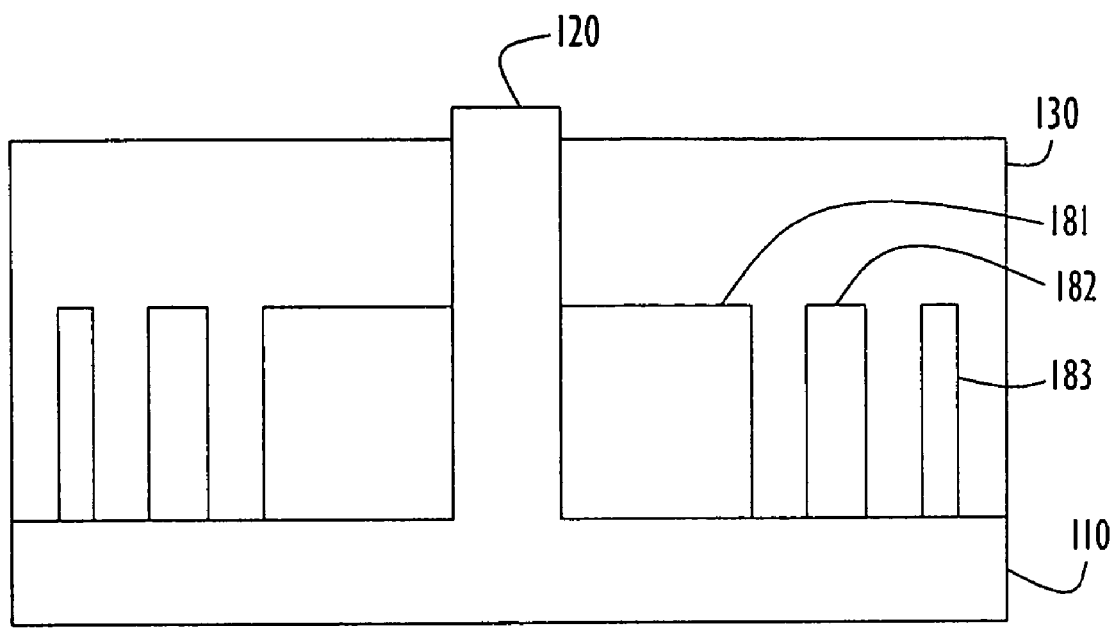
FIGS. 15 and 16 are side views of a fin including at least one cut-out of a vapor-augmented heatsink having a plurality of geometries and/or dimensions.
Figure 16:
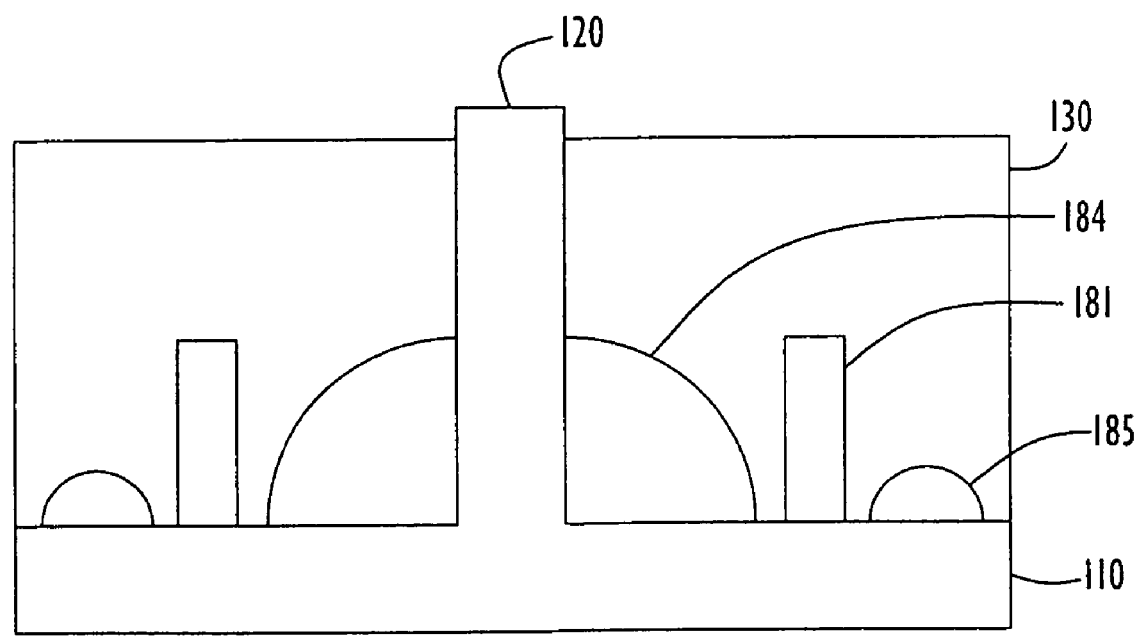

Referring to FIGS. 15 and 16, the fin 130 of the vapor-augmented heatsink can include at least one cut-out 181, 182, 183, 184, 185 having a plurality of geometries and/or dimensions. In FIG. 15, for instance, the fin 130 includes a plurality of cut-outs 181, 182, 183 having the same shape (geometry), i.e., rectangular, but have different sizes (dimensions). In another example, in FIG. 16, the fin 130 includes a plurality of cut-outs 181, 184, 185 having different shapes (geometries), i.e., rectangle, semi-circle, quarter-circle, and having different sizes (dimensions).

A number of implementations have been described. Nevertheless, it will be understood that various modifications may be made without departing from the spirit and scope. Accordingly, other embodiments are within the scope of the following claims.

What is claimed is:

1. A heat transfer device, comprising:
   at least one chamber containing a condensable fluid, the chamber including: an evaporation region configured to be coupled to a heat source for vaporizing the condensable fluid, and a condensation region comprising condensation surfaces configured to permit the vaporized condensable fluid to collect as condensate, wherein the at least one chamber is configured to cause the condensate to flow through increasingly less area in the vicinity of the evaporation region, giving rise to a converging flow condition as the condensate approaches the evaporation region; and
   a multi-wick structure comprising a plurality of hydraulically interconnected wick structures extending from the evaporation region into the condensation region for facilitating flow of the condensate toward the evaporation region, wherein a wicking power of the multi-wick structure increases with decreasing flow distance to the evaporation region to facilitate an increased flow rate of the condensate as the condensate approaches the evaporation region.

2. The heat transfer device of claim 1, wherein the multi-wick structure includes at least one of: a mesh, a groove formed on a surface of the at least one chamber, a powder wick, and a foam wick.

3. The heat transfer device of claim 1, wherein the multi-wick structure has a spatially varying wick structure that varies in accordance with the condensate's spatial flow requirements as the condensate travels toward the evaporation region.

4. The heat transfer device of claim 3, wherein the multi-wick structure includes at least one of: a mesh, a groove formed on a surface of the at least one chamber, a powder wick, and a foam wick.

5. A heat transfer device, comprising:
   at least one chamber containing a condensable fluid, the chamber including: an evaporation region configured to be coupled to a heat source for vaporizing the condensable fluid, and a condensation region comprising condensation surfaces configured to permit the vaporized condensable fluid to collect as condensate; and
   a multi-wick structure comprising a plurality of hydraulically interconnected wick structures extending from the evaporation region into the condensation region for facilitating flow of the condensate toward the evaporation region, wherein a wicking power of the multi-wick structure increases with decreasing flow distance to the evaporation region to facilitate an increased flow rate of the condensate as the condensate approaches the evaporation region, wherein the multi-wick structure has a spatially varying wick structure that varies in accordance with the condensate's spatial flow requirements as the condensate travels toward the evaporation region, and the spatially varying wick structure includes a spatially varying quantity of wicking structure.

6. A heat transfer device, comprising:
   at least one chamber containing a condensable fluid, the chamber including: an evaporation region configured to be coupled to a heat source for vaporizing the condensable fluid, and a condensation region comprising condensation surfaces configured to permit the vaporized condensable fluid to collect as condensate; and
   a multi-wick structure comprising a plurality of hydraulically interconnected wick structures extending from the evaporation region into the condensation region for facilitating flow of the condensate toward the evaporation region, wherein a wicking power of the multi-wick structure increases with decreasing flow distance to the evaporation region to facilitate an increased flow rate of the condensate as the condensate approaches the evaporation region, wherein the multi-wick structure includes at least one wick structure bridge interconnecting portions of the multi-wick structure to facilitate flow of the condensate between the portions of the multi-wick structure.

7. The heat transfer device of claim 6, wherein the wick structure bridge comprises an internal support structure for the at least one chamber.

8. The heat transfer device of claim 1, wherein the multi-wick structure includes a wick structure with decreasing porosity with decreasing flow distance to the evaporation region.

9. The heat transfer device of claim 1, further comprising at least one fin in thermal contact with the at least one chamber.

10. The heat transfer device of claim 9, wherein the at least one fin includes at least one opening through which air can flow.

11. A heat transfer device, comprising:
at least one chamber containing a condensable fluid, the chamber including an evaporation region configured to be coupled to a heat source for vaporizing the condensable fluid, the vaporized condensable fluid collecting as condensate on surfaces within the at least one chamber;
at least one fin in thermal contact with the at least one chamber, wherein the at least one chamber includes a base chamber and a fin chamber, wherein the at least one fin is coupled to the fin chamber; and
a multi-wick structure comprising a plurality of hydraulically interconnected wick structures disposed within the at least one chamber for facilitating flow of the condensate toward the evaporation region.

12. The heat transfer device of claim 11, wherein the at least one fin is further coupled to the base chamber.

13. The heat transfer device of claim 12, wherein the at least one fin includes at least one opening through which air can flow.

14. A heat transfer device, comprising:
at least one chamber containing a condensable fluid, the chamber including an evaporation region configured to be coupled to a heat source for vaporizing the condensable fluid, the vaporized condensable fluid collecting as condensate on surfaces within the at least one chamber, wherein the at least one chamber has a substantially inverted T-shaped configuration; and
a multi-wick structure comprising a plurality of hydraulically interconnected wick structures disposed within the at least one chamber for facilitating flow of the condensate toward the evaporation region.

15. The heat transfer device of claim 1, wherein the at least one chamber has a substantially double inverted T-shaped configuration.

16. The heat transfer device of claim 1, wherein the at least one chamber has a substantially U-shaped configuration.

17. The heat transfer device of claim 1, wherein the at least one chamber has a substantially W-shaped configuration.

18. The heat transfer device of claim 1, wherein the at least one chamber includes an internal support structure to prevent collapse of the least one chamber.

19. A method of manufacturing a heat transfer device, comprising:
forming at least one chamber containing a condensable fluid, the chamber including: an evaporation region configured to be coupled to a heat source for vaporizing the condensable fluid, and a condensation region comprising condensation surfaces configured to permit the vaporized condensable fluid to collect as condensate, wherein the at least one chamber is configured to cause the condensate to flow through increasingly less area in the vicinity of the evaporation region, giving rise to a converging flow condition as the condensate approaches the evaporation region; and
forming a multi-wick structure comprising a plurality of hydraulically interconnected wick structures extending from the evaporation region into the condensation region for facilitating flow of the condensate toward the evaporation region, wherein the multi-wick structure is formed such that a wicking power of the multi-wick structure increases with decreasing flow distance to the evaporation region to facilitate an increased flow rate of the condensate as the condensate approaches the evaporation region.

20. The method of claim 19, wherein the multi-wick structure is formed to have a spatially varying wick structure that varies in accordance with the condensate's spatial flow requirements as the condensate travels toward the evaporation region.

21. A method of manufacturing a heat transfer device, comprising:
forming at least one chamber containing a condensable fluid, the chamber including: an evaporation region configured to be coupled to a heat source for vaporizing the condensable fluid, and a condensation region comprising condensation surfaces configured to permit the vaporized condensable fluid to collect as condensate; and
forming a multi-wick structure comprising a plurality of hydraulically interconnected wick structures extending from the evaporation region into the condensation region for facilitating flow of the condensate toward the evaporation region, wherein the multi-wick structure is formed such that a wicking power of the multi-wick structure increases with decreasing flow distance to the evaporation region to facilitate an increased flow rate of the condensate as the condensate approaches the evaporation region, wherein the multi-wick structure is formed to include at least one wick structure bridge interconnecting portions of the multi-wick structure to facilitate flow of the condensate between the portions of the multi-wick structure.

22. The heat transfer device of claim 3, wherein at least a portion of the multi-wick structure comprises a mesh disposed on a groove structure.

23. The heat transfer device of claim 3, wherein at least a portion of the multi-wick structure comprises a foam wick disposed on a groove structure.

24. The heat transfer device of claim 5, wherein the spatially varying quantity of wicking structure comprises increased layering of mesh at the evaporation region.

25. The heat transfer device of claim 5, wherein the spatially varying quantity of wicking structure comprises an increased amount of sintered powder at the evaporation region.

* * * * *

UNITED STATES PATENT AND TRADEMARK OFFICE
CERTIFICATE OF CORRECTION

| | | |
|---|---|---|
| PATENT NO. | : 7,422,053 B2 | |
| APPLICATION NO. | : 11/272145 | |
| DATED | : September 9, 2008 | |
| INVENTOR(S) | : Wing Ming Siu | |

It is certified that error appears in the above-identified patent and that said Letters Patent is hereby corrected as shown below:

On the Title Page, Item (56) the following U.S. PATENT DOCUMENTS are added to the References Cited section:

3598180 8/1971 Moore, Jr.
4009417 2/1977 Waldon et al.
4125387 11/1978 Gunter
4145708 3/1979 Ferro et al.
4279294 7/1981 Fitzpatrick et al.
4523636 6/1985 Meijer et al.
4616699 10/1986 Grote
4785875 11/1988 Meijer et al.
4944344 7/1990 Crowe
5198889 3/1993 Hisano et al.
5216580 6/1993 Davidson et al.
5309986 5/1994 Itoh
5379830 1/1995 Itoh
5386143 1/1995 Fitch
5427174 6/1995 Lomolino, Sr. et al.
5458189 10/1995 Larson et al.
5582242 12/1996 Hamburgen et al.
5587880 12/1996 Phillips et al.
5632158 5/1997 Tajima
5642776 7/1997 Meyer, IV et al.
5647430 7/1997 Tajima
5694295 12/1997 Mochizuki et al.
5704416 1/1998 Larson et al.
5769154 6/1998 Adkins et al.

(continued on next page)

Signed and Sealed this
Sixth Day of March, 2012

David J. Kappos
*Director of the United States Patent and Trademark Office*

5780928 7/1998 Rostoker et al.
5880524 3/1999 Xie
5924481 7/1999 Tajima
6062302 5/2000 Davis et al.
6082443 7/2000 Yamamoto et al.
6085831 7/2000 DiGiacomo et al.
6150195 11/2000 Chiu et al.
6158502 12/2000 Thomas
6163073 12/2000 Patel
6167948 1/2001 Thomas
6189601 2/2001 Goodman et al.
6208513 3/2001 Fitch et al.
6237223 5/2001 McCullough
6244331 6/2001 Budelman
6374905 4/2002 Tantoush
2001/0025701 10/2001 Ikeda et al.
2002/0021556 2/2002 Ibene, II et al.
2002/0056908 5/2002 Brownell et al.
2002/0182397 12/2002 Whatley
2002/0195231 12/2002 Siu On the Title Page, Item (56) the following OTHER PUBLICATIONS are added to the References Cited section:

COSTLOW, "Thermacore uses water to vaporize a CPU's heat," (new base for processor heat sinks) (Company Business and Marketing), Electronic Engineering Times, Vol. 1, p. 63, Jan. 18, 1999.

"Components - Thermacore throws cold water on CPU heat issue," (Therma-Based liquid-cooled heat sink) (Product Announcement), Electronic Buyers' News, Vol. 1, p. 5, Feb. 1, 1999.

TAKE, "Fundamental Investigation of Roll Bond Heat Pipe as Heat Spreader Plate for Notebook Computers," IEEE Transactions on Components and Packaging Technologies, Vol. 23, No. 1, pp. 80-85, March 2000.

BOWMAN et al., "Comparison of standard and heat-pipe fins with specified tip temperature condition," Journal of Thermophysics and Heat Transfer, Vol. 15, No. 4, pp. 421-426, 2001. (Abstract Only)

MOORES et al., "Thermal Characterization of a Liquid Cooled ALSiC Base Plate with Integral Pin Fins," IEEE Transactions on Components and Packaging Technologies, Vol. 24, No. 2, pp. 213-219, June 2001.

(continued on next page)

MURTHY et al., "Single Chamber Compact Two-Phase Heat Spreaders with Microfabricated Boiling Enhancement Structures," IEEE Transactions on Components and Packaging Technologies, Vol. 15, No. 1, pp. 156-163, March 2002.

LIN et al., "High performance miniature heat pipe," International Journal of Heat and Mass Transfer," Vol. 45, pp. 3131-3142, 2002.

BUSH, "Smart heat pipe uses capillary action to cool all hot spots," Electronics Weekly, p. 5, Dec. 18, 2002.

KALAHASTI et al., "Performance Characterization of a Novel Flat Plate Micro Heat Pipe Spreader," IEEE Transactions on Components and Packaging Technologies, Vol. 25, No. 4, pp. 554-560, December 2002.

"This pipe 'smokes' to keep cool," EDN, p. 24, January 9, 2003.

(12) INTER PARTES REEXAMINATION CERTIFICATE (0378th)
United States Patent
Siu

(10) Number: US 7,422,053 C1
(45) Certificate Issued: May 8, 2012

(54) VAPOR AUGMENTED HEATSINK WITH MULTI-WICK STRUCTURE

(75) Inventor: Wing Ming Siu, Kowloon (HK)

(73) Assignee: Convergence Technologies (USA), LLC, Reston, VA (US)

Reexamination Request:
No. 95/000,534, Feb. 11, 2010

Reexamination Certificate for:
Patent No.: 7,422,053
Issued: Sep. 9, 2008
Appl. No.: 11/272,145
Filed: Nov. 14, 2005

Certificate of Correction issued Mar. 6, 2012.

Related U.S. Application Data

(63) Continuation of application No. 10/390,773, filed on Mar. 19, 2003, now abandoned.
(60) Provisional application No. 60/380,274, filed on May 15, 2007.

(51) Int. Cl.
*H05K 7/20* (2006.01)

(52) U.S. Cl. .............................. 165/104.26; 165/104.33; 361/700

(58) Field of Classification Search ..................... 165/80
See application file for complete search history.

(56) References Cited

To view the complete listing of prior art documents cited during the proceeding for Reexamination Control Number 95/000,534, please refer to the USPTO's public Patent Application Information Retrieval (PAIR) system under the Display References tab.

*Primary Examiner*—Sara Clarke

(57) ABSTRACT

A heat transfer device includes a base chamber, a fin chamber, and at least one fin. The chambers can be thermally coupled. The heat transfer device also includes a wick structure. The wick structure can include a multi-wick structure. The multi-wick structure can include a three-dimensional wick structure and/or a spatially varying wick structure.

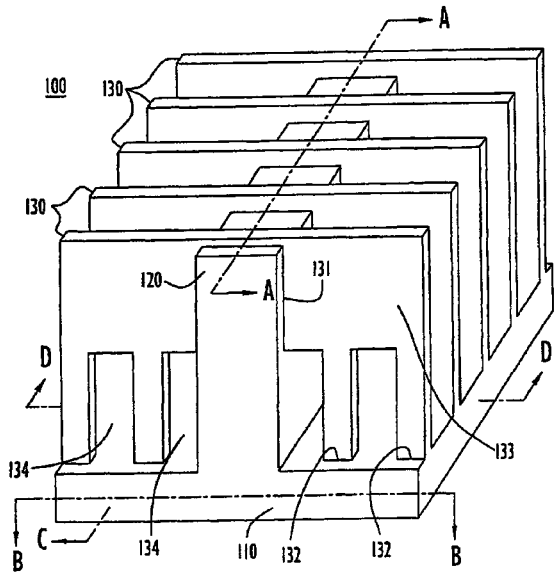

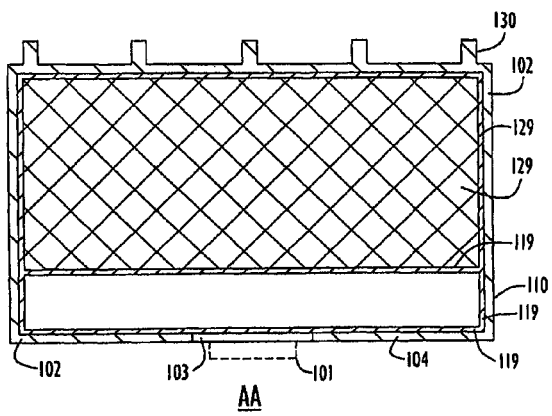

INTER PARTES REEXAMINATION CERTIFICATE ISSUED UNDER 35 U.S.C. 316

THE PATENT IS HEREBY AMENDED AS INDICATED BELOW.

AS A RESULT OF REEXAMINATION, IT HAS BEEN DETERMINED THAT:

Claims 8, 11-17 and 22 are cancelled.

Claims 1-7, 9, 10, 18-21 and 23-25 were not reexamined.

* * * * *

(12) INTER PARTES REEXAMINATION CERTIFICATE (1150th)
United States Patent
Siu

(10) Number: US 7,422,053 C2
(45) Certificate Issued: Aug. 7, 2015

(54) VAPOR-AUGMENTED HEATSINK WITH MULTI-WICK STRUCTURE

(75) Inventor: Wing Ming Siu, Kowloon (HK)

(73) Assignee: CONVERGENCE TECHNOLOGIES (USA), LLC, Reston, VA (US)

Reexamination Request:
No. 95/001,749, Sep. 8, 2011

Reexamination Certificate for:
Patent No.: 7,422,053
Issued: Sep. 9, 2008
Appl. No.: 11/272,145
Filed: Nov. 14, 2005

Reexamination Certificate C1 7,422,053 issued May 8, 2012

Certificate of Correction issued Mar. 6, 2012

Related U.S. Application Data

(63) Continuation of application No. 10/390,773, filed on Mar. 19, 2003, now abandoned.

(60) Provisional application No. 60/380,274, filed on May 15, 2002.

(51) Int. Cl.
*H05K 7/20* (2006.01)
*F28D 15/02* (2006.01)
*F28D 15/04* (2006.01)

(52) U.S. Cl.
CPC .......... *F28D 15/0233* (2013.01); *F28D 15/046* (2013.01); *H01L 2924/00* (2013.01); *H01L 2924/0002* (2013.01); *Y10T 29/49353* (2015.01)

(58) Field of Classification Search
None
See application file for complete search history.

(56) References Cited

To view the complete listing of prior art documents cited during the proceeding for Reexamination Control Number 95/001,749, please refer to the USPTO's public Patent Application Information Retrieval (PAIR) system under the Display References tab.

*Primary Examiner* — Sara Clarke

(57) ABSTRACT

A heat transfer device includes a base chamber, a fin chamber, and at least one fin. The chambers can be thermally coupled. The heat transfer device also includes a wick structure. The wick structure can include a multi-wick structure. The multi-wick structure can include a three-dimensional wick structure and/or a spatially varying wick structure.

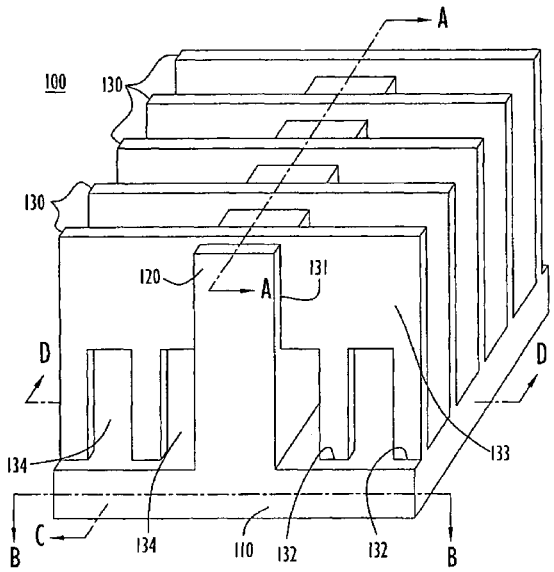
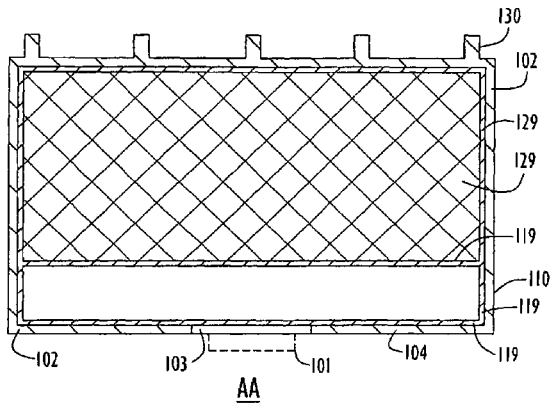

INTER PARTES REEXAMINATION CERTIFICATE

THE PATENT IS HEREBY AMENDED AS INDICATED BELOW.

AS A RESULT OF REEXAMINATION, IT HAS BEEN DETERMINED THAT:

Claims 8, 11-17 and 22 were previously cancelled.
Claims 1-5, 9, 18-20 and 24 are cancelled.
Claims 6, 7, 10, 21, 23 and 25 were not reexamined.

\* \* \* \* \*